(12) United States Patent
See et al.

(10) Patent No.: US 7,825,399 B2
(45) Date of Patent: Nov. 2, 2010

(54) OPTICAL DEVICE AND METHOD OF FABRICATING AN OPTICAL DEVICE

(75) Inventors: Patrick Un Siong See, Cambridge (GB); Andrew James Shields, Cambridge (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/076,878

(22) Filed: Mar. 11, 2005

(65) Prior Publication Data
US 2005/0230694 A1 Oct. 20, 2005

(30) Foreign Application Priority Data
Mar. 11, 2004 (GB) ................................ 0405509.1

(51) Int. Cl.
*H01L 29/06* (2006.01)
(52) U.S. Cl. .................... 257/14; 257/20; 257/E21.407; 438/34; 438/38
(58) Field of Classification Search ............. 257/14, 257/20, E21.407; 320/220; 380/220; 438/34, 438/38
See application file for complete search history.

(56) References Cited

U.S. PATENT DOCUMENTS

| | | | | |
|---|---|---|---|---|
| 5,070,509 A | * | 12/1991 | Meyers | 372/45.01 |
| 5,104,824 A | * | 4/1992 | Clausen et al. | 438/34 |
| 5,889,288 A | * | 3/1999 | Futatsugi | 257/20 |
| 6,465,811 B1 | * | 10/2002 | Peters et al. | 257/99 |
| 6,728,281 B1 | | 4/2004 | Santori et al. | |
| 6,956,232 B2 | * | 10/2005 | Reynolds | 257/14 |
| 7,015,498 B2 | * | 3/2006 | Ebe et al. | 257/14 |
| 2003/0152228 A1 | * | 8/2003 | Gerard et al. | 380/220 |

FOREIGN PATENT DOCUMENTS

JP 6-326399 11/1994
WO WO 2004/015454 A2 2/2004

OTHER PUBLICATIONS

Patent Abstracts of Japan, JP 01-090585, Apr. 7, 1989.
M. Manimaran, et al., "Realization of nanopillars on GaAs quantum well structure grown by molecular beam epitaxy", Microelectronics Journal, vol. 30, 1999, pp. 899-903.

* cited by examiner

*Primary Examiner*—Wael M Fahmy
*Assistant Examiner*—John C Ingham
(74) *Attorney, Agent, or Firm*—Oblon, Spivak, McClelland, Maier & Neustadt, L.L.P.

(57) ABSTRACT

An optical device comprising:
  a first active stack of layers comprising an optical cavity,
  at least one quantum dot located in said cavity;
  an upper contact provided above said optical cavity;
  a lower contact provided below said cavity,
wherein an abrupt material interface defines the whole lateral boundary of said cavity and said cavity is patterned such that it provides two dimensional lateral confinement of photon modes, said upper an lower contacts being arranged such that current can flow vertically across the cavity between the two contacts.

7 Claims, 32 Drawing Sheets

(d)

(e)

(f)

(c)

(d)

(e)

(f)

(g)

(h)

(a)

(b)

(c)

(d)

(e)

(a)

(b)

(c)

(d)

(d)

(e)

(a)

(b)

OPTICAL DEVICE AND METHOD OF FABRICATING AN OPTICAL DEVICE

BACKGROUND OF THE INVENTION

The present invention relates to the field of optical devices and methods for their fabrication. Particularly, the present invention is concerned with sources and detectors for single photons.

In a particular type of photon source and/or detector, it is desirable to fabricate an optical cavity with a narrow effective lateral area. It is also necessary to be able to apply a bias across the optical cavity. These two aims can conflict with one another since it is difficult to reliably fabricate a device where electrical contact is made to a cavity which has a narrow effective lateral area.

One technique has involved for an optical cavity with a restricted size by patterning the mirrors above and below the cavity. Examples of this technique are described in Choquette et al., Proceedings of the IEEE 85, pages 1730 to 1739 (1997), Choquette et al., IEEE Journal of Selected Topics in Quantum Electronics 3, pages 916 to 926 (1997), Iga, IEEE Journal of Selected Topics in Quantum Electronics 6, pages 1201 to 1215 (2000) and Chua et al, IEEE Photonics Technology Letters, 9 pages 551 to 553 (1997) where the mirrors are oxidised in order to reduce the effective size of the cavity without reducing the actual size of the device to allow easy contact.

E. R. Brown et al., IEEE Transactions on Microwave Theory and Techniques, 40 pages 846 to 850 (1992) describes technique for making electrical contact to a semiconfocal open cavity resonator. Electrical contact is achieved by using a metal whisker.

Transport based devices tend to be easier to fabricate than optical devices since they do not require an optical cavity to be defined in addition to any means for restricting the sport of carriers through the device. Jones et al. IEEE Transactions on Microwave Theory and Techniques 45, pages 512 to 518 (1997) describe a varactor transport device where contact is made between a contact pad and anode using a metal airbridge finger. A metal whisker is used to make contact to another varactor in Raisanen, Proceedings of the IEEE 80, pages 1842 to 1852 (1992).

Randall et al. J. Vac. Sci. Technol. B6, pages 302 to 305 (1987) describes resonant tunnelling diode transport devices formed by etching narrow pillars.

SUMMARY OF THE INVENTION

The present invention attempts to address the above problems and in a first aspect provides an optical device comprising:

a first active stack of layers comprising an optical cavity,
at least one quantum dot located in said cavity;
an upper contact provided above said optical cavity;
a lower contact provided below said cavity, wherein an abrupt material interface defines the whole lateral boundary of said cavity and said cavity is patterned such that it provides two dimensional lateral confinement of photon modes, said upper an lower contacts being arranged such that current can flow vertically across the cavity between the two contacts.

The boundary of the optical cavity is defined by an abrupt material interface. For example, the cavity itself is patterned and optical confinement is achieved directly from the patterning of the optical cavity itself as opposed to patterning of layers above and/or below the cavity.

Preferably, the cavity laterally extends over an area with dimensions of the order of the wavelength of a photon emitted from said quantum dot. For example, the diameter of the cavity may be substantially equal to the wavelength of a photon emitted by or absorbed by the quantum dot. Typically, the quantum dot will have a lateral area of approximately 200 to 400 $nm^2$ and preferably about 300 $nm^2$. The lateral area of the emissive region or cavity is less than $10^{-10}$ $m^2$ cavity may comprise a singe active quantum dot. The cavity may thus comprise a plurality of quantum dots where just one of them emits photons of the desired wavelength or the cavity may comprise just a single quantum dot. The output from a single quantum dot in a plurality of quantum dots may be selected by filtering, for example, configuring the cavity so that it is resonant with photons having the wavelength of the selected quantum dot. Alternatively, the cavity may comprise a plurality of active quantum dots.

The active stack of layers is preferably taller than it is wide.

In a particularly preferred embodiment, the upper contact comprises a semiconductor layer.

More preferably, the upper contact forms a bridge. For example, the upper contact may extend between a first contact stack of layers and said first active stack of layers, said upper contact connecting said first contact stack and said first active stack of layers, such that said upper contact is suspended between and physically supported by first contact stack and said active stack of layers. Thus, the upper contact forms a bridge between the contact stack and the active stack. The upper contact is supported by both the active stack and contact stack such that it does not require any further fillers or insulators provided underneath the span of the bridge for support. However, further fillers or insulators may be provided underneath the span of the bridge.

The cavity is preferably defined by at least one Bragg mirror or the like, thus, the device preferably further comprises a lower mirror region having a stack of alternating layers of a first type and a second type, said layers of a first type having a different refractive index to those of the second type and said stack of layers being configured to act as a mirror for said optical device, said stack of alternating layers being provided below said optical cavity to at least partially define said optical cavity, The lower mirror region may be provided in said active stack of layers and said first contact stack, said lower mirror region being patterned such that it is not present in the region between said contact stack and said active stack, such that said upper contact region is suspended between and physically supported by the parts of said lower mirror region provided in said fist contact region and said first active stack of layers.

The lower contact is preferably in the form of a layer which may be provided below said lower mirror region and/or between said lower mirror region and said optical cavity, a so-called intracavity contact.

The device may also comprise an upper mirror region, said upper mirror region comprising a stack of alternating layers of a third type and a fourth type, said layers of a third type having a different refractive index to those of the fourth type and said stack of layers being configured to act as a mirror for said optical device, said upper mirror region being provided above said optical cavity to at least partially define said optical cavity.

The mirror regions may comprise dopants such that they will also form part of the upper and/or lower contact.

The upper mirror region may comprise fewer layers than the lower mirror region to allow radiation to more easily exit the device through the upper mirror region.

In a preferred embodiment, the upper contact comprises a patterned layer which has a substantially elongate section and said lower contact comprises a patterned layer which has a substantially elongate section and wherein the major axis of the first and second elongate sections are arranged to cross one another. More preferably, the major axis of the first and second elongate sections are arranged substantially perpendicular to one another.

Generally, the active stack is provided at the intersection of the upper contact and lower contact.

The active stack is patterned in two lateral dimensions so that it can provide two dimensional lateral confinement.

The upper mirror region may be patterned with the active stack so that it is flush with the stack on all sides, or it may be patterned with the upper contact so that it is flush with the upper contact. Alternatively, the upper mirror may be patterned so that the top part of the mirror is flush with the upper contact and the lower part of the mirror is flush with the active stack.

Similarly, the lower mirror region may be patterned with the active stack so that it is flush with the stack on all sides, or it may be patterned with the lower contact so that it is flush with the lower contact. Alternatively, the upper mirror may be patterned so that the lower part of the mirror is flush with the lower contact and the upper part of the mirror is flush with the active stack.

An insulator may be provided sounding the optical cavity. Typical insulators which may be used are polyimide, silicon nitrite, silicon dioxide, spin on glass, etc.

In an alternative embodiment, the optical cavity is surrounded by an insulator and the upper contact is placed on both the active stack and the insulator so that the insulator at least partially supports the upper contact.

In order to allow light to enter or be emitted from the device, the upper contact is preferably substantially transparent to the wavelength of radiation emitted from or absorbed by the quantum dot.

The active stack of layers is preferably between 1 and 3 μm in diameter, more preferably between 1.5 and 2.5 μm, even more preferably around 2 μm.

In a second aspect, the present invention provides a method of fabricating an optical device, said method comprising:
forming a lower contact layer,
forming an active stack of layers overlying said lower contact layer, said active stack of layers comprising an optical cavity and at least one quantum dot located in said cavity;
forming an upper contact to said optical cavity; and
patterning said cavity such that an abrupt material interface defines the whole lateral boundary of said cavity and said cavity is patterned such that it provides two dimensional lateral confinement of photon modes,
wherein said upper and lower contacts being arranged such that current can flow vertically across the cavity between the two contacts.

Preferably, the patterning of said cavity takes place after said upper contact is formed and wherein said upper contact is a semiconductor layer.

In an embodiment of the invention, said step of patterning said cavity comprises wet etching through a resist, said resist and the layers of the device being configured such that said etch undercuts said upper contact to form a suspended bridge. The resist may be a photo resist or an e-beam resist such as PMMA.

The cavity may be defined by upper an/or lower Bragg mirrors, thus the method may further comprise forming a lower mirror region below said cavity, said lower mirror region comprising a stack of alternating layers of first type and a second type, said layers of a first type having a different refractive index to those of the second type and said stack of layers being configured to act as a mirror for said optical device.

The lower mirror region may be laterally etched to form the suspended upper contact, thus the method may comprise laterally etching at least one of said layers in said lower mirror region using a first selective wet etch configured to etch the first type of layers of said lower mirror region such that at least one of said first type of layers is removed from underneath selected sections of said upper contact; and
laterally etching at least one of said layers in said lower mirror region using a second selective wet etch configured to etch the second type of layers of said lower mirror region such that at least one of said second type of layers is removed from underneath selected sections of said upper contact such that parts of said upper contact are suspended.

The method may also comprise forming an upper mirror region above said cavity, said upper mirror region comprising a stack of alternating layers of a third type and a fourth type, said layers of a third type having a different refractive index to those of the fourth type and said stack of layers being configured to act as a mirror for said optical device.

The upper mirror region may be patterned by
laterally etching at least one of said layers in a said upper mirror region using a third selective wet etch configured to etch the third type of layers of said upper mirror region such that at least one of said third type of layers is removed from underneath selected sections of said upper contact; and
laterally etching at least one of said layers in said upper mirror region using a fourth selective wet etch configured to etch the fourth type of layers of said upper mirror region such that at least one of said fourth type of layers is removed from underneath selected sections of said upper contact such that parts of said upper contact are suspended.

The first and third type of layers may be the same. Also the second and fourth type of layers may be the same. Similarly, the first and third etchants may be the same and/or the second and fourth etchants may be the same.

Examples of layer systems which may form a Bragg reflector or the like and which may be selectively etches as described above are GaAs/AlAs, $Al_{1-x}Ga_xAs/GaAs$, InGaP/GaAs, $In_xGa_{1-x}As/GaAs$, etc.

In a preferred arrangement, said lower contact is patterned to form an elongate section and said upper contact is patterned to form an elongate section, the major axis of the upper and lower contacts' elongate sections are arranged to cross one another.

The lower mirror region may be formed after said lower contact or the lower contact may be provided between said mirror region and said cavity.

Said lower contact may be patterned by wet etching through a resist, said resist and the layers of the device being configured such that said etch undercuts said upper contact to form a suspended bridge.

In general, the suspended upper contact is formed by etching said layers vertically, then using a selective etch to undercut the upper contact to suspend the upper contact. The vertical etch may be a dry etch or a wet etch.

Preferably, the method comprises forming an etch top layer which is not preferentially attacked by the selective etch, said etch stop layer being located at least at the depth of the bottom of the vertical etch. This layer prohibits the lateral etch vertically etching the structure and hence enhances the efficiency of the lateral etch.

In an alternative embodiment, the method further comprises providing an insulator around said patterned cavity.

The insulator is preferably provided to the device by a spun-on process or evaporation, sputtering etc, The evaporation may be thermal evaporation or e-beam evaporation.

Regardless of the method used to provide the insulator to the device, it is preferable if a protective layer is provided to the top of said active stack prior to providing said insulator. A protective layer allows a good clean surface on the top of the active stack to be recovered. This is desirable to provide good ohmic contacts to the stack.

Preferably, the protective layer comprises a resist, e.g. photoresist or e-beam resist. More preferably, the resist has an undercut profile. The resist is preferably the resist used to define the active stack. Alternatively a different material may be used. This material may be applied and self aligned under the resist used to define the active stack. The protective layer should be chosen from materials that will not degrade during the subsequent processing stages, but should be easily removable to allow a clean surface to be exposed on the top of said active stack.

When the insulator is provided by a spun-on process, the insulator is preferably etched or recessed to expose the top of said active stack and providing said top contact so that it is partially supported by said insulator.

When the insulator is provided by an evaporation process, the active stack is preferably tilted with the respect to the flux during the evaporation process and is rotated during the evaporation process.

More preferably, the active stack is tilted such that its top surface forms and angle from 5° to 30° to a plane perpendicular to the flux direction during evaporation and rotated at a rotation rate from 10 to 100 revolutions per minute.

Preferably, a protective layer is used if the insulator is to be evaporated. This allows insulator provided on said protective layer to be removed using a lift-off process to expose the top of the active stack. The top contact is provided so that it is partially supported by said insulator surrounding the active stack.

The top contact is preferably transparent to allow light to be collected from the top of the stack.

The above fabrication methods may be used for a number of different types of devices, for example, single photon emitters based on InAs quantum dots in a resonant tunnelling diode or for supporting or passivating sidewalls for high aspect micropillars, etc.

BRIEF DESCRIPTION OF THE DRAWINGS

The present invention will now be described with reference to the following non-limiting embodiments in which.

DETAILED DESCRIPTION

Figure 1:
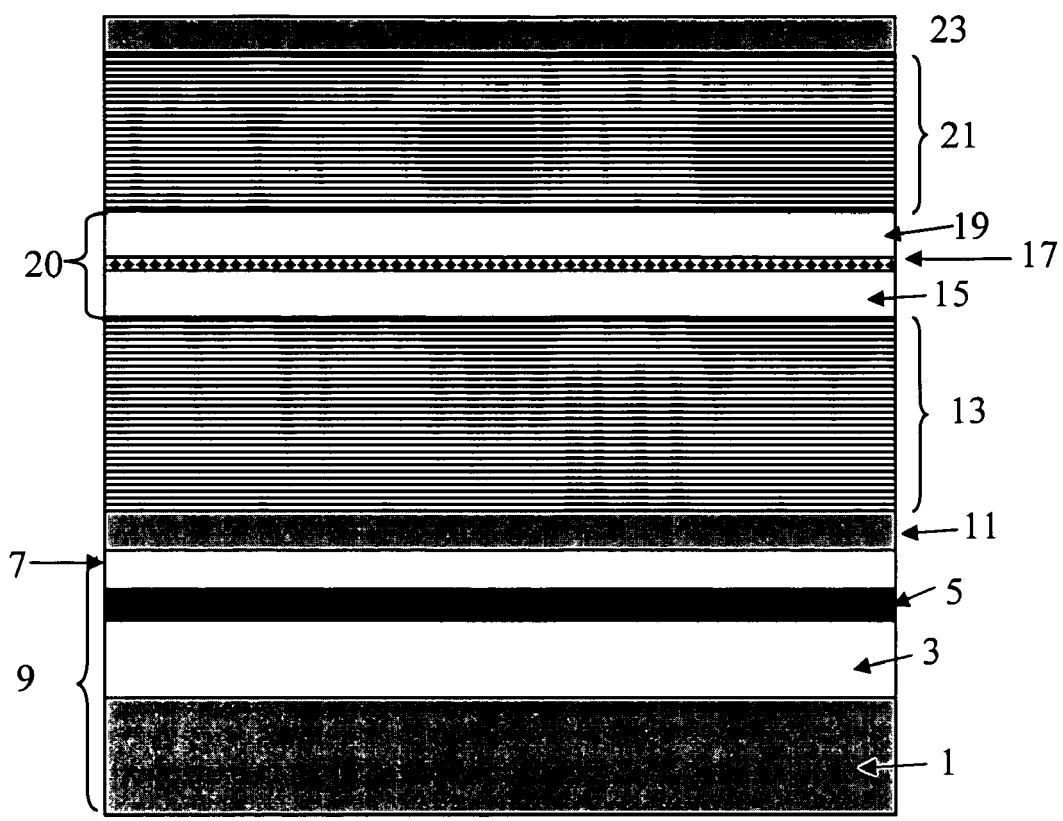
FIG. 1 is a schematic layer structure of a semiconductor device which may be patterned to form a device in accordance with an embodiment of the present invention.

FIG. 1 schematically illustrates a typical layer structure which may be used in a device in accordance with the present invention. The layer structure is typically fabricated by an epitaxial growth technique such as molecular beam epitaxy. However, other common crystal growth techniques and latticed matched techniques may be employed, e.g. metal-organo chemical vapour deposition. The structure in this particular example is fabricated on a semi-insulating GaAs substrate 1. Buffer layer 3 is provided overlying and in contact with said substrate 1. Buffer layer 3 comprises 500 nm of intrinsic GaAs. Etch stop layer 5 is then provided overlying and in contact with said buffer layer 3. Etch stop layer 5 comprises 130 nm of undoped AlAs. This layer functions as a first matrix layer. A second matrix layer 7 is then provided overlying and in contact with said etch stop layer. Said second matrix layer comprises 200 nm of intrinsic GaAs. The first and second matrix layers 5, 7 may be repeated a number of times in the sample in case more than one etch stop layer is required, for example, in a case where the sample is accidentally over-etched during one of the etching stages which will be described with reference to FIGS. 2 to 13.

Other bi-layer material systems that can form DBRs and also selectively etched may also be used e.g. $Al_{1-x}Ga_xAs$/GaAs, InGaP/GaAs, $In_xGA_{1-x}As$/GaAs, etc.

Layers 1 to 7 form the base 9 of the structure. First p-type electrode layer 11 is formed overlying and in contact with said second matrix layer 7. First p-type electrode layer 11 comprises 250 nm of p-type GaAs with Be doping of $5\times10^{18}$ $cm^{-3}$. Carbon doping may also be used in order to dope p-type layer 11 and carbon doping may be preferable especially when Be diffusion causes problems.

Lower distributed Bragg reflector 13 is then formed overlying and in contact with said first p-type contact layer 11. Lower distributed Bragg reflector (DAB) comprises eleven pairs of altering 95.3 nm GaAs and 111.7 nm AlAs layers, all p-doped with Be at $1\times10^{18}$ cm$^{-3}$. The number of repeats required depends on the measure of the mirror reflectivity. Preferably, the alternating stack can comprise from two to fifty periods, In any case, the thickness of these layers satisfies the relation $$n_a t_a = n_b t_b = \lambda/4$$

whereby $n_i$ and $t_i$ are the refractive index and thickness respectively of materials a and b and $\lambda$, the desired mission wavelength.

When the layers of lower DBR 13 are doped, they may also be used as part of the contact structure. Lower cavity layer 15 is then provided overlying and in contact with said lower DBR 13. Said lower cavity layer comprises 95.3 nm intrinsic GaAs.

In a variation on the device of FIG. 1, a second p-type contact layer is formed between said lower DBR mirror and said lower cavity layer 15. Said second contact layer comprising 150 nm of Be doped p-type GaAs. This second contact layer allows an intracavity contact to be made to the device. This will be described in more detail with reference to FIGS. 7, 8 and 9.

Quantum dot layer 17 is then provided overlying and in contact with said lower cavity layer 15. Quantum dot layer 17 is provided overlying and in contact with said lower cavity layer 15. Quantum dot layer 17 is formed by growing approximately 1.8 monolayers of InAs. Due to the lattice mismatch between InAs and GaAs, the InAs forms self-assembled islands on the wafer surface following the Stranskii-Krastinov growth mechanism. By controlling the amount and shape of the InAs deposited, the quantum dots of layer 17 can be tuned to emit the desired wavelength.

Upper cavity layer 19 is then provided overlying and in contact with said quantum dot layer 17. Upper cavity layer 19 comprises 95.3 nm of intrinsic GaAs. This layer also serves as a capping layer for dot layer 17.

The total thickness of the cavity, i.e. upper and lower cavity layers 15 and 19 with quantum dot layer 17 should obey the relation $$L_c = (m\lambda)/(2n_c)$$

whereby m is an integer and $n_c$, the average refractive index of the cavity. The layers 15, 17 and 19 define an active region or cavity region 20.

Upper distributed Bragg reflector 21 is then formed overlying and in contact with said upper cavity layer 19. Upper DBR 21 comprises eight periods of alternating 111.7 nm AlAs and 95.3 nm GaAs. These layers are n-doped with Si at $2\times10^{18}$ cm$^{-3}$. As expected, the number of repeats and layer thickness should follow similar conditions for the lower DBR 13. Generally, the upper DBR 21 will have fewer layers than the lower DBR 13 to allow radiation to exit the device through the upper surface.

Finally, n-type electrode 23 is then formed overlying and in contact with said upper DBR 21. n-type electrode 23 comprises 150 nm of n-type GaAs Si-doped with a concentration of $2\times10^{18}$ cm$^{-3}$.

In the above structure, p-type layers are located below the cavity region and n-type layers above. However, the order of the layers may be reversed. In use, a bias is applied between upper n-type contact layer 23 and lower p-type contact layer 11. If an intracavity contact layer as described above is provided, the bias may be applied between upper n-type contact layer 23 and intracavity p-type contact layer (not shown). This causes electrons and holes to be injected into quantum dots in layer 17 for recombination and emission of photons. If the output from a single quantum dot is selected, the device is configured as a single photo source.

The structure of FIG. 1 is given as an example of a structure which may be patterned in accordance with the methods described with referenced to FIGS. 2 to 13. However, any structure may be used where it is necessary to isolate a layer located near the top of the structure, e.g. contact layer 23 from lower layers where a DBR or similar structure of alternating layers is provided underneath the upper layer.

Figure 2:
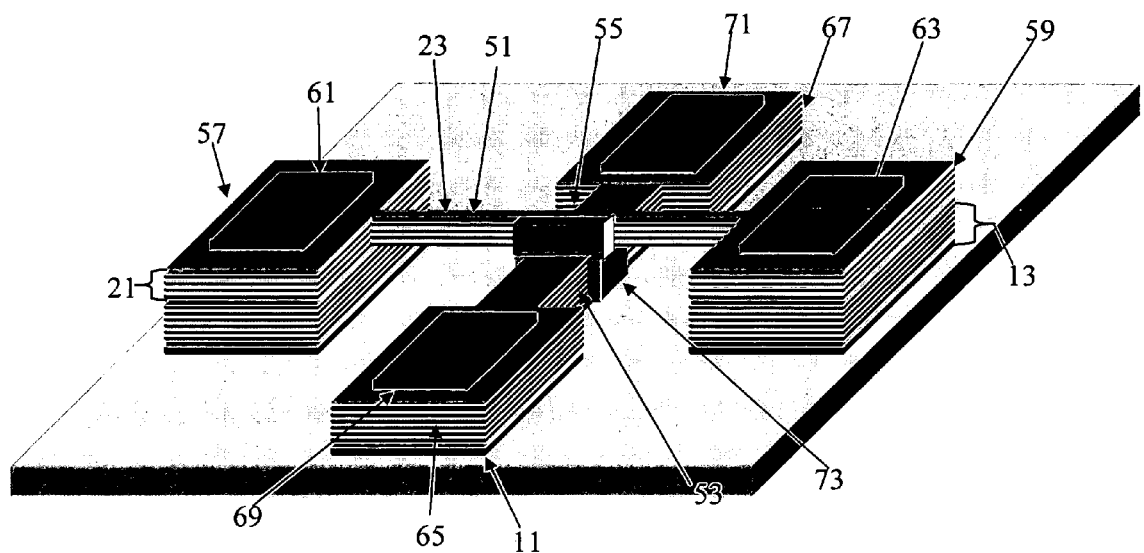
FIG. 2 is a device in accordance with a first embodiment of the present invention.

FIG. 2 schematically illustrates a device in accordance with a first embodiment of the present invention. In this embodiment, the layer structure described with reference to FIG. 1 is patterned to form a crosswire arrangement with an upper wire 51 arranged perpendicular to a lower wire 53. The upper wire 51 comprises upper and type contact electrode 23 (FIG. 1) and upper DBR 21 (FIG. 1). The lower wire 53 comprises first p-type contact layer 11 and lower DBR 13 (FIG. 1). The active region or stack which is formed by upper cavity layer 19, dot layer 17 and lower cavity layer 15 is located at the intersection 55 of upper and lower wires 51, 53. The active region is patterned in two dimensions so that it has the narrowest width of the lower wire 53 in one dimension and the narrowest width of the upper wire 51 in the other dimension.

Upper wire 51 is connected to first 57 and second 59 contact stacks at either end. Upper wire 51 contact stacks 57, 59 both comprise the plurality of layers detailed in relation to FIG. 1. Metal electrodes 61, 63 are formed on upper wire contact stacks 57, 59 respectively.

Lower wire 55 is connected at either end to lower wire contact stacks 65 and 67. Contact stacks 65 and 67 comprise lower DBR 13 and p-type contact layer 11 (FIG. 1). Metal electrodes 69, 71 are formed on lower wire contact stacks 65, 67 respectively.

Passivation film 73 is provided at the sides of the intersection of the DBRs between the upper wire 51 and the lower wire 53.

The intersection between the upper wire 51 and the lower wire 53 comprises an active region flanked on either side by the upper DBR 21 (FIG. 1) and a lower DBR 13 (FIG. 1). Thus, an active device is produced which may be contacted using upper wire contact stacks 57, 59 through upper wire 51 or lower wire contact stacks 65, 67 to lower wire 53.

The upper conducting wire 51 is electrically isolated from the lower conducting wire 53. The charge injected into the upper contact stacks 57, 59 travels along upper wire 51 and charge injected into the lower contact stacks 65, 67 travels along lower wire 53. The actual geometry of the intersection can be tailored for the appropriate application, e.g. circular mesa with three or more symmetrically centered contact arms to each layer.

FIGS. 3a to 3h described how the device illustrated in FIG. 2 may be fabricated. The layer structure detailed in FIG. 1 is first grown structure 101. FIG. 3a, a simplified layer structure is shown where some of the layers of FIG. 1 are omitted 500 nm of photoresist is spun and patterned to form a thin narrow line, 103, which is approximately 1 µm wide or less. At the ends of the narrow line 103 there are masked regions 105 and 107. The sample is then subjected to a reactive ion etching process e.g. using a $SiCl_4$ gas plasma. The structure is etched partway into the lower section of the undoped GaAs cavity layer 15 (FIG. 1). The results of this etch are shown in FIG. 3b. It can be seen that the anisotropic etch produces a near vertical wall mesa 109. The photoresist is then removed to expose a thin wire 111 connected to stack 113 and stack 115. Thin wire 111 and stacks 113 and 115 currently comprise all layers of the structure shown in FIG. 1 from partway through the lower cavity layer 15.

Next, contacts are formed to the structure. First and second lower p-type contacts 117 and 119 are formed on the etched layer. Contacts 117 and 119 are formed in a line which approximately bisects thin wire 111. These contacts are p-type contacts and are intended to make electrical connection to the lower DBR 13 and lower p-type contact layer 11. The contact is formed from AuBe alloy and is deposited by thermal evaporation onto predefined areas using the standard lift-off technique. The alloy is then annealed at 480° C. for 180 seconds in a forming gas. Any other suitable alloy which forms ohmic contacts to p-type GaAs and p-type AlAs could be used, for example AuZn.

Next, first and second n-type contacts 121 and 123 are made to upper contact stacks 113 and 115 respectively. Following a similar process to the lower p-type contacts 117, 119. In other words, the contacts are defined using a standard lift-off process. A series of metals, namely Ni/AuGe/Ni/Au in this sequence are deposited by thermal evaporation without breaking the vacuum onto predefined areas using a standard lift-off technique. The alloy is then annealed at 400° C. for 60 seconds in a forming gas. As before, any other suitable alloy which forms ohmic contacts to the n-type GaAs and n-type AlAs could be used, for example Pd/Ge or Ag/Ge. The n-type contacts are formed after the p-type contacts because annealing of the n-type contacts will not affect the p-type contacts as the p-type contacts have a much higher annealing temperature.

Once the contacts have been formed, 2.8 μm of photoresist, much thicker than the wire 111, is spun and patterned as shown in FIGS. 3d and 3e. FIG. 3d is a three-dimensional view of the photoresist, FIG. 3e is cross section along line A-A' shown in FIG. 3d. As can be seen from FIG. 3d, the photoresist covers both the wire 111 and contact stacks 113, 115. The photoresist is thick enough that it covers the sides of the contact stacks and wire as well. In addition to covering the contact stacks 113, 115 and wire 111, the photoresist also covers p-type contacts 117, 119 (not shown) and defines a second narrow wire 131 between these contacts.

The sample is then exposed to reactive ion etching in a $SiCl_4$ gas plasma which is arbitrarily stopped partway in the p-type GaAs layer 11 as shown in FIG. 3f (see FIG. 1). This etch exposes the sides of the lower DBR mirror 13. Specifically, the sides 141 and 143 of lower DBR mirror 13 in con act stacks 113 and 115 are exposed. Also, the sides 145 and 147 of lower DBR mirror 13 in lower wire 131 are exposed and also the sides of the lower DBR mirror 13 under first wire 111 are exposed. Wet chemical etching may also be used providing that the undercut of the etch is negligible.

With a photoresist in place, the sample is then subject to a further etch in a solution $C_6H_8O_7$ and $H_2O_2$ (7:1 volume ratio). This isotropic etching preferentially removes GaAs only but not AlAs. (Strictly speaking, the dissolution of AlAs does actually take place but it is significantly slower than GaAs in the solution.) Therefore, the p-type GaAs in the lower DBR mirror and the lower p-type GaAs electrode 11 and the intrinsic GaAs layers are removed in all directions, i.e. downwards and sideways. Once the etching consumes the intrinsic Gas and encounters the AlAs stop layer 5, the downward chemical reaction is inhibited. However, the lateral etch is allowed to continue until all the exposed p-type GaAs are removed leaving p-type AlAs layers in the bottom DBR 13 as is shown in FIG. 3g. Other suitable etch solutions may be used, for example $NH_4OH:H_2O_2$.

The process is then repeated using etch which selectively removes the AlAs layers and which does not etch GaAs. Typically, a buffered HF etch is used. The use of both of these etches allows the first wire 11 to form a suspended contact. Other suitable etch solutions may be used, for example concentrated HCl. Finally, the photoresist mask is dissolved in the appropriate solvent.

Thus, the structure may be fabricated using just four photolithography steps:

Step 1) to define first upper wire 111 and contact stacks 113, 115 as shown in FIG. 3a;

Step 2) to form p-type contacts;

Step 3) to form n-type contacts;

Step 4) pattern structure laterally as shown in FIG. 3f which is then further laterally etched using selective etchings to undercut upper wire 111 to form a suspended bridge.

Additionally, an insulator passivation film may be included to encapsulate the intersection region to minimise oxidation of the AlAs layers. This step may be achieved by photoimaging a spin on insulator through standard lithography, e.g. polyimide. Other alternative methods include the etch back and planarisation of an insulator, e.g. patterning of $Si_3N_4$ deposited by vapour deposition or wet oxidation of the AlAs into inert $Al_xO_y$ layers in a thermal furnace.

Figure 4:
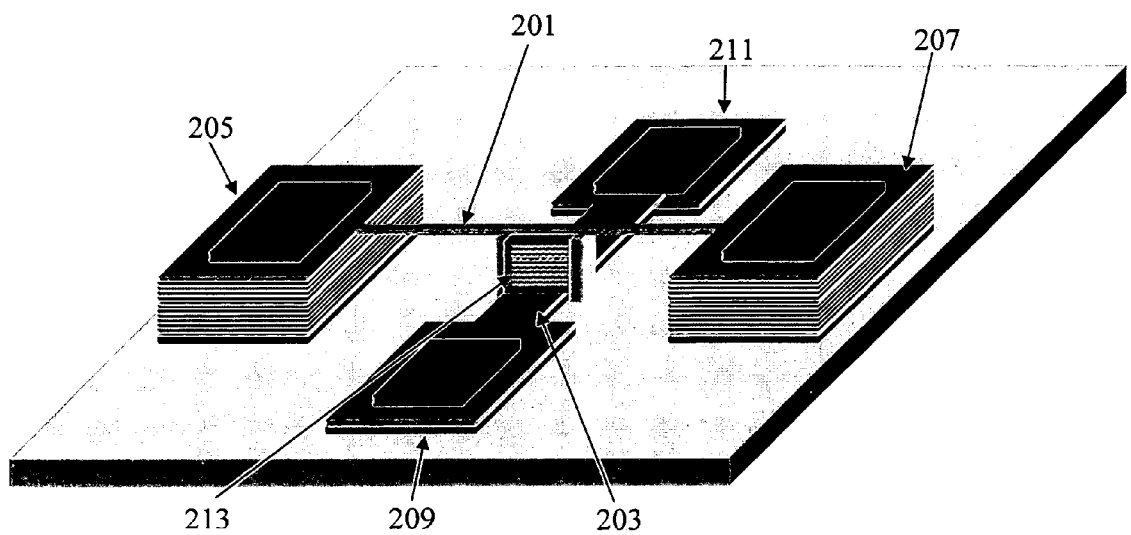
FIG. 4 is a schematic of a device in accordance with a second embodiment of the present invention.
Figure 5:
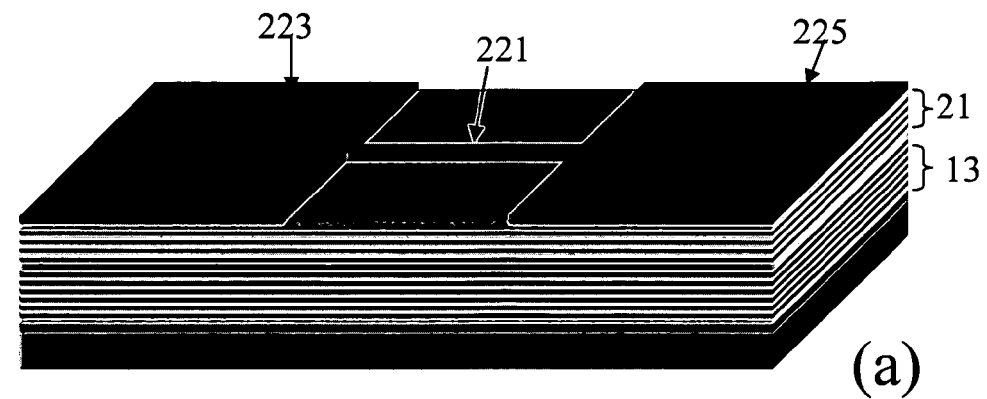
FIGS. 5a to 5h schematically illustrate fabrication stages for the device of FIG. 4.
Figure 5:
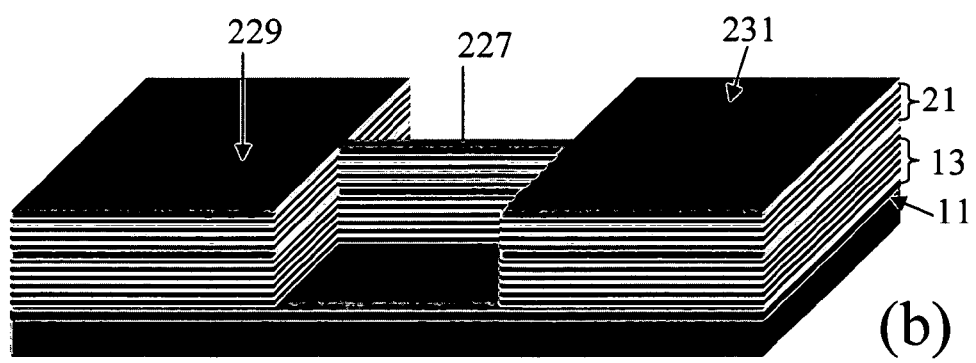
Figure 5:
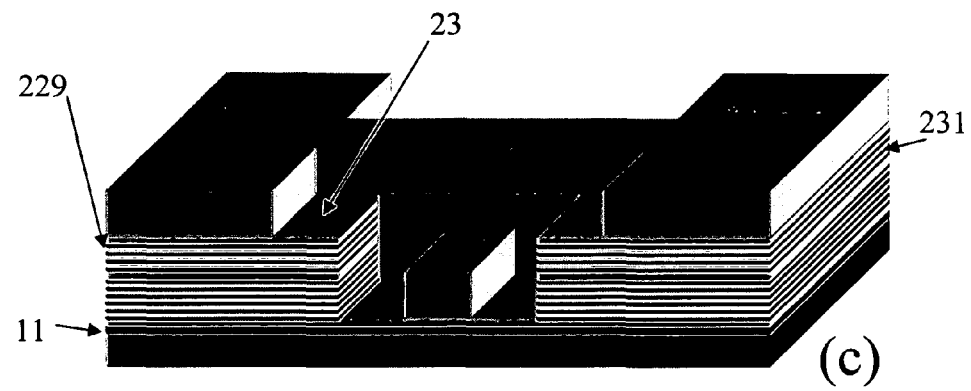
Figure 5:
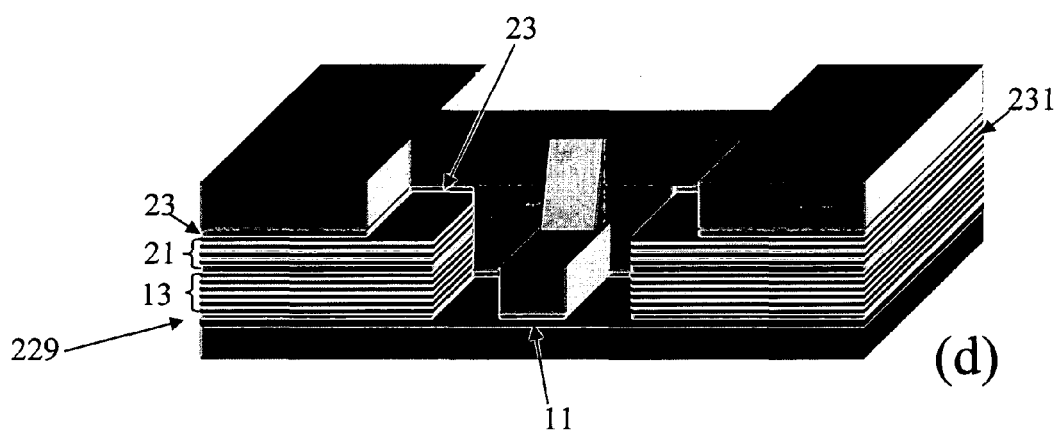
Figure 5:
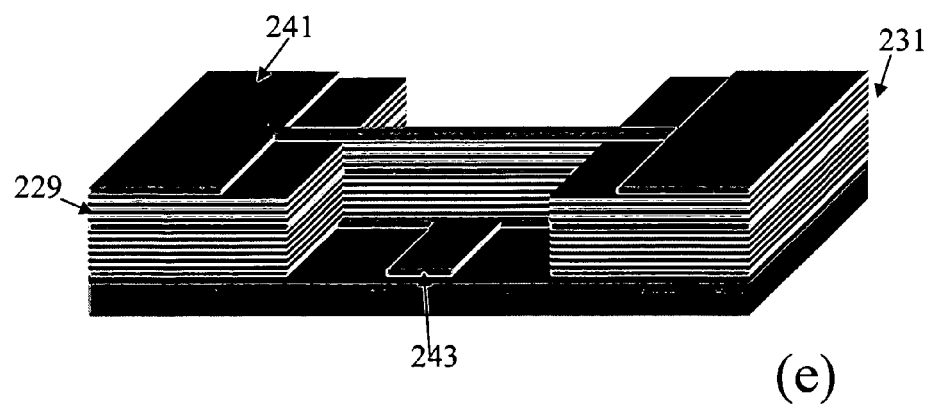
Figure 5:
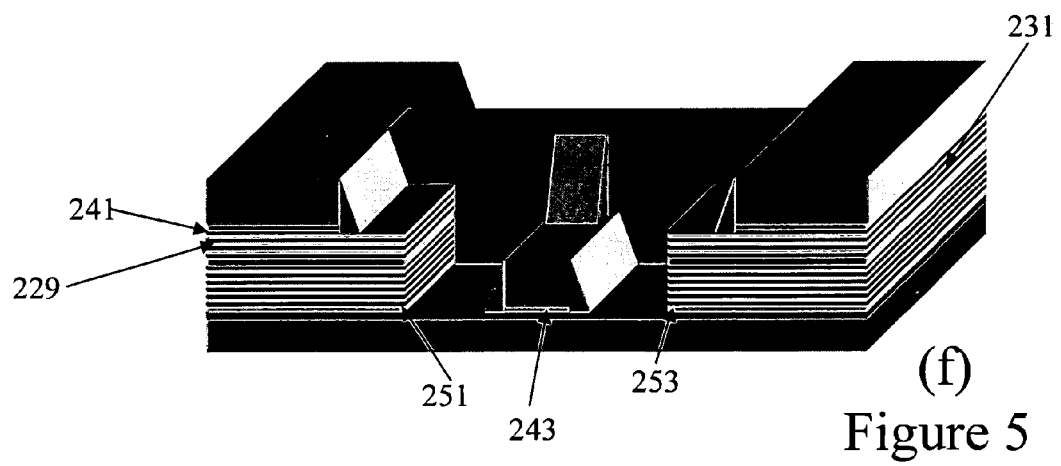
Figure 5:
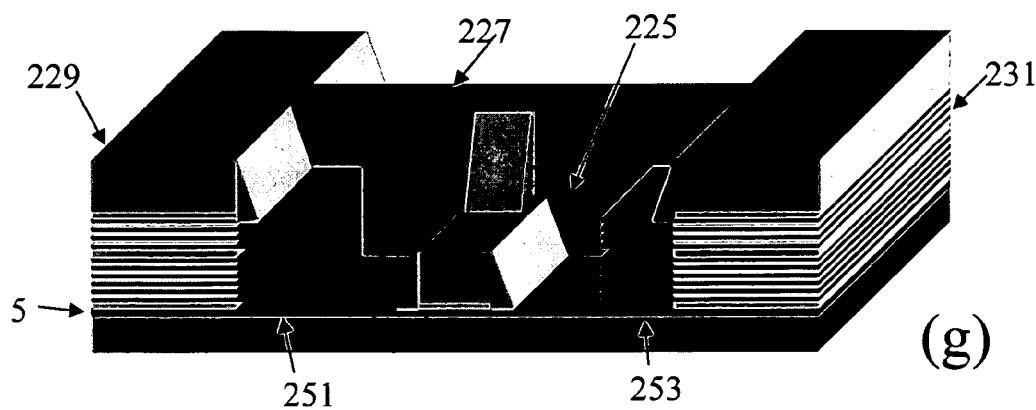
Figure 5:
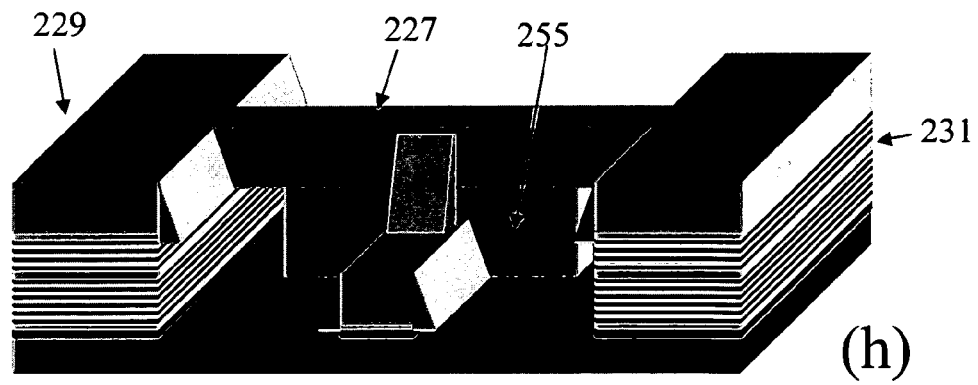

FIG. 4 schematically illustrates a second embodiment of the present invention, As for FIG. 2, the device of FIG. 4 is fabricated by patterning the structure described with reference to FIG. 1 but may be used for other layer structures. The device of FIG. 4 again comprises a cross-wire structure with a first suspended thin top wire 201 arranged perpendicular to a lower wire 203. The top wire is connected at either end to top wire contact stacks 205 and 207, the lower wire is connected to lower wire contact stacks 209 and 211. The top wire is formed of a single contact layer and the bottom wire comprises a contact layer. Neither wire 201 nor wire 203 comprise the upper and/or lower DBRs of FIG. 1. Thus, the structure differs from that described with reference to FIG. 2. An active region which comprises an optical cavity defined by upper and lower DBRs is formed as a narrow vertical pillar 213 at the intersection of upper wire 201 and lower wire 203.

In the device of FIG. 4, the vertical pillar 213 where both the mirrors as well as the active layer are formed in a pillar structure is believed to provide better optical confinement than the device of FIG. 2.

Fabrication of the device of FIG. 4 will now be described with reference to FIGS. 5a to 5h.

Figure 3:
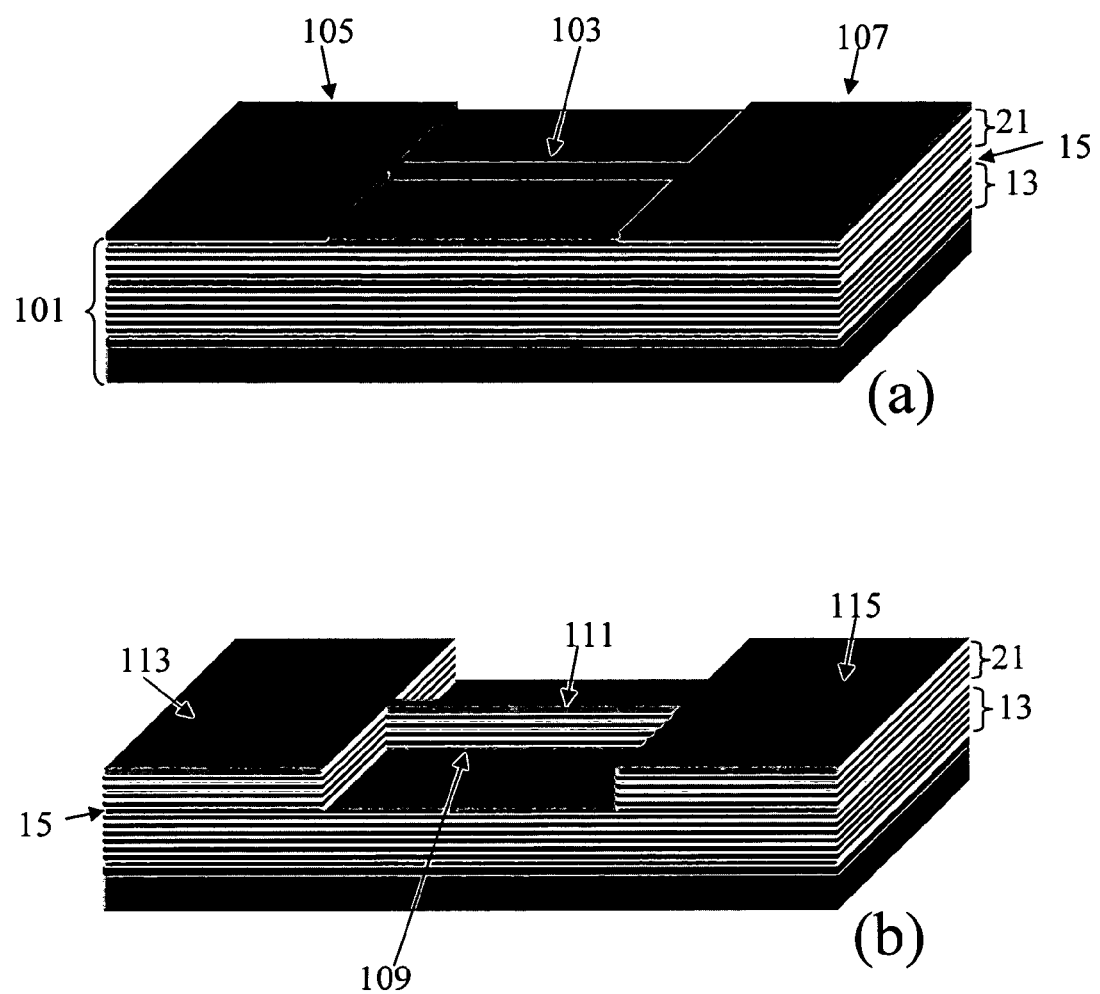
FIGS. 3a to 3h are fabrication stages of a device in accordance with a first embodiment of the present invention.
Figure 3:
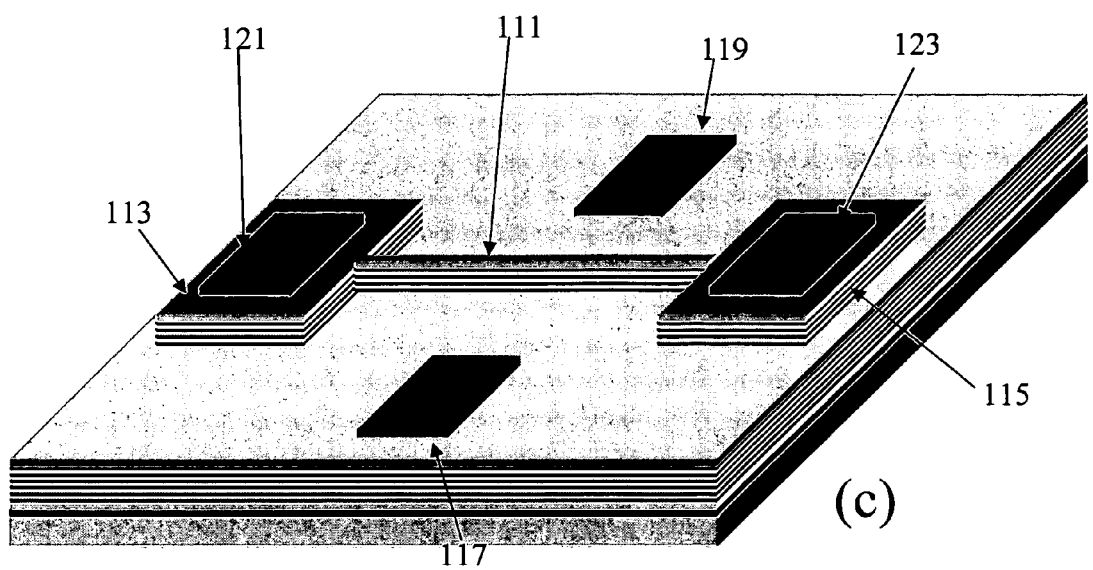
Figure 3:
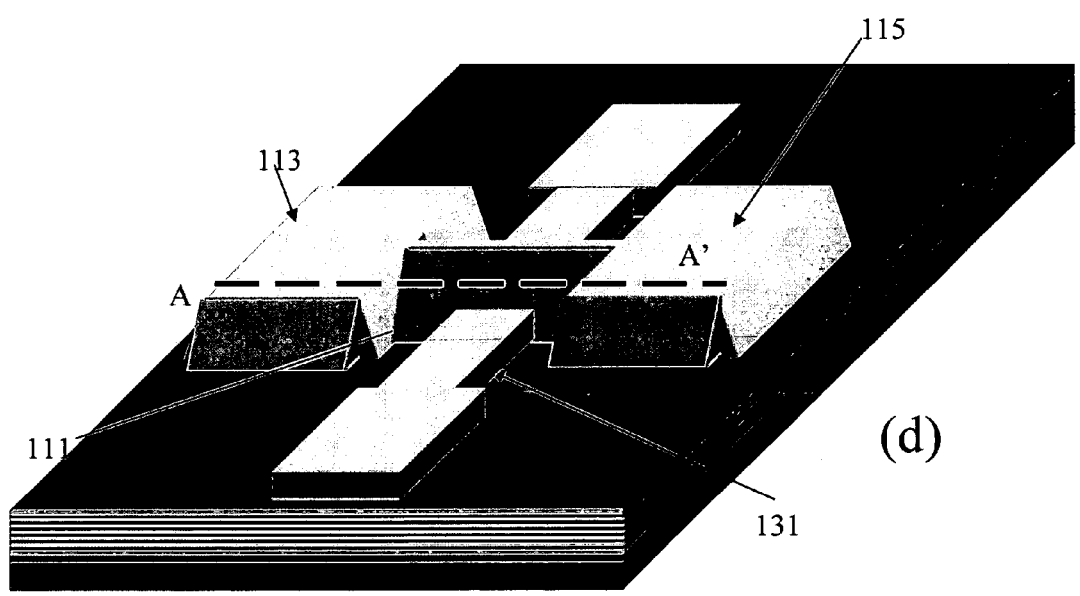
Figure 3:
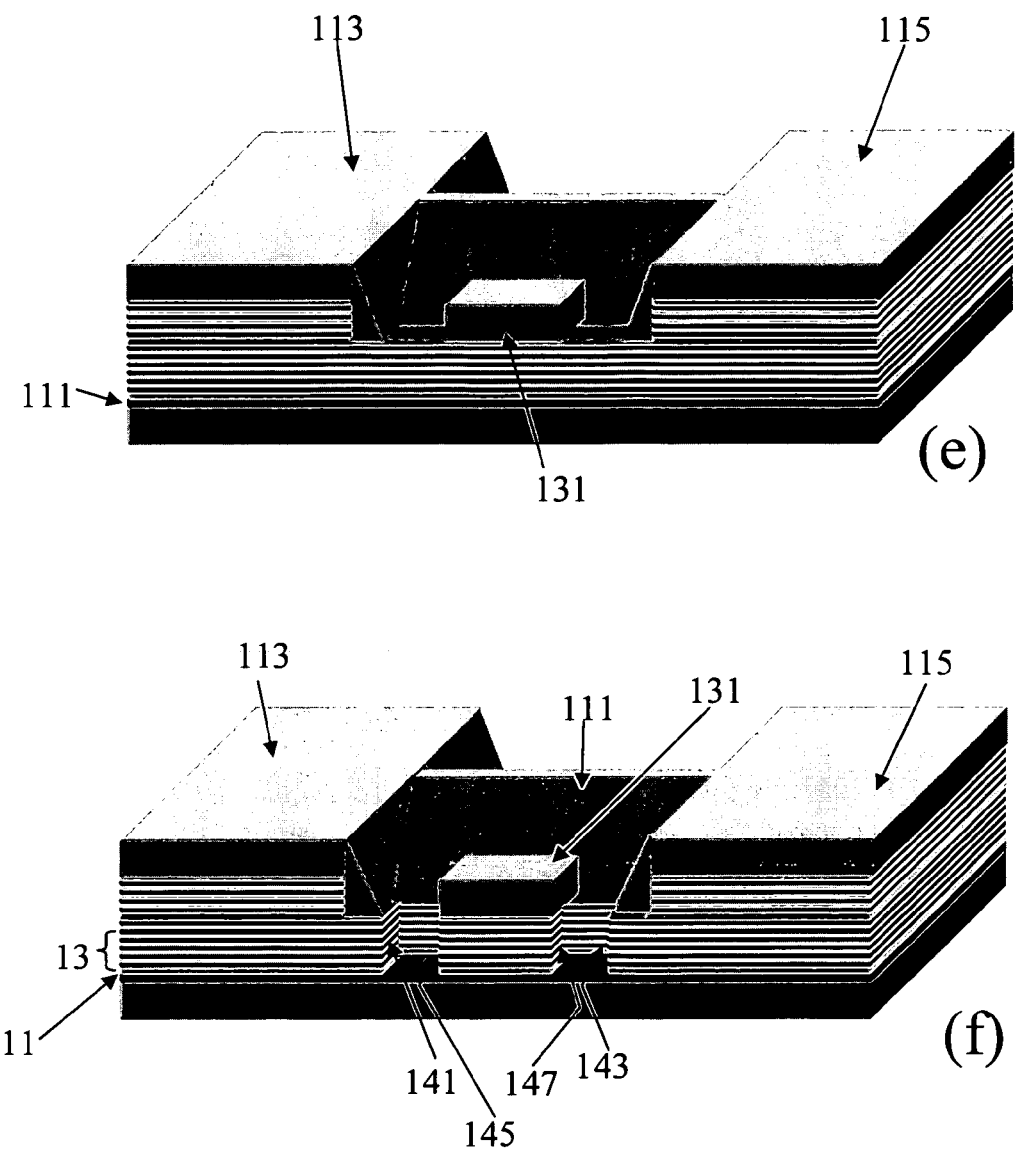
Figure 3:
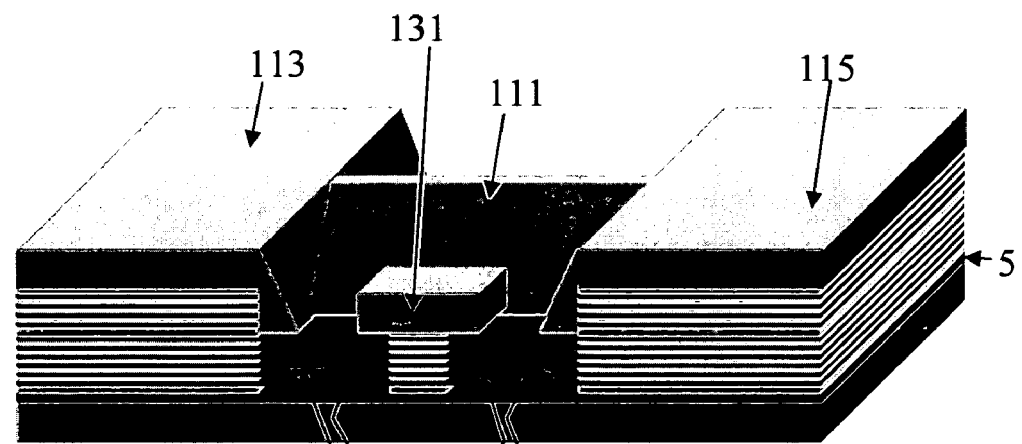
Figure 3:
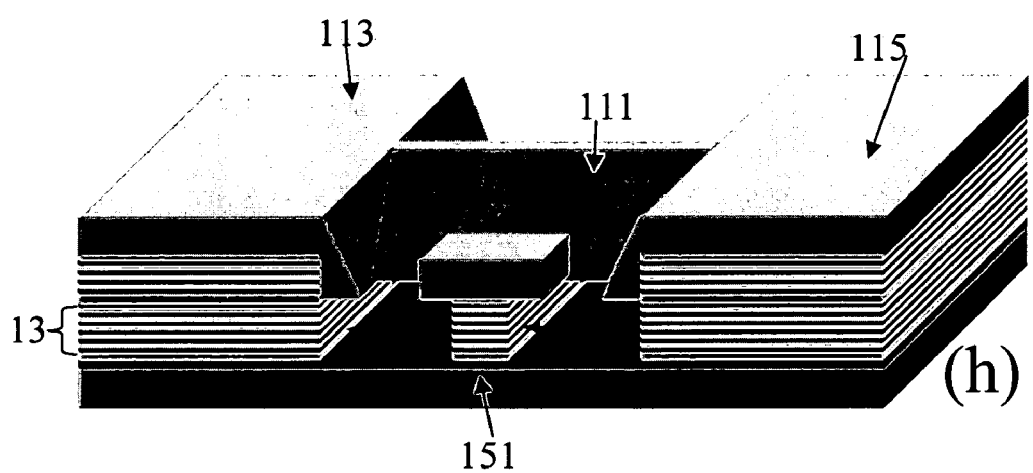

In the same manner as the device of FIG. 2 described in FIG. 3, first, a thin layer of photoresist is spun onto the structure as shown in FIG. 5a. The photoresist is in the pattern of a narrow first wire 221 connected at either end to contact pads 223 and 225. The wire has approximately a width of 1 μm.

The structure is then etched by dry etching and the etch is stopped part-way into the bottom p-type GaAs electrode 11 or the first p-type GaAs layer of the lower DBR 13 (FIG. 1). The etching may also be performed by wet etching techniques providing that the wet etch does not cause a substantial undercut. Once the photoresist is removed, the structure shown in FIG. 5b is obtained which has a narrow wire 227 provided between first 229 and second 231 contact stacks. The wire 221 and first 229 and second 231 contact stacks comprise all the layers shown in FIG. 1 down to either part of the p-type electrode 11 or the lower p-type GaAs layer of lower DBR 13 depending on the depth of the etch.

Two further photolithography steps are then performed in order to define n-type and p-type contacts. These have not been shown. However, they are formed in exactly the same way as described with reference to FIG. 3c of the first embodiment and their final position is shown in FIG. 4. Next, upper contact layer 23 and lower p-type contact layer 11 are patterned. In FIG. 5c, photoresist is provided to mask first wire 227 and part of the n-type contact layer 23 provided on contact pads 229 and 231 to define a pattern for the upper a-type contact layer 23.

The photoresist also covers the newly formed p-type contact (not shown) and defines the shape of the p-type contact. Thus, part of the n-type GaAs contact layer 23 is exposed at the edges of contact stacks 229 and 231 and the lower part of either the lower GaAs p-type layer of lower DBR 13 or the p-type electrode layer 11. The structure is then etched as shown in FIG. 5d. The structure is then etched with a selective chemical etch to remove the GaAs using the n-type AlAs layer of upper DBR 21 and etch stop layer 5 as etch stops. Depending on the thickness of photoresist used, this etch may be continued in order to undercut part of upper wire 227. However, in this case, the etch is used only to define the upper n-type electrode 23 and p-type electrode 11.

The patterned n-type electrode layer 241 and p-type electrode layer 243 are indicated in FIG. 5e. Patterned n-type electrode layer 241 is recessed away from the edges of upper wire contact stacks 229 and 231. Patterned p-type electrode layer 243 now lies just in a thin strip bisecting upper contact wire, underneath upper contact wire and underneath upper wire contact stacks 229, 231.

Next, a thick layer of photoresist is spun and patterned to protect both the top n-type patterned electrode 241 and lower p-type patterns electrode 243. This layer is thick enough to prevent the n-type electrode 241 and p-type electrode 243 from being undercut during a subsequent etch. The thick photoresist is patterned such that the sides 251 and 253 of contact stacks 229 and 231 are exposed.

This structure as shown in FIG. 5f is then first etched using a selective etch which selectively removes GaAs. This is shown in FIG. 5g. A typical etchant may be $C_6H_8O_7$:$H_2O_2$ etchant. The sides of the contact stacks 229 and 231 are thus attacked by the etch. The etch extends underneath upper contact wire 227 and as the GaAs layers are etched, the etch also starts to penetrate under photoresist 255 which masks part of the underneath of layer 227 due to the removal of layers from contact stacks 229 and 231.

The AlAs layers which form the upper and lower DBRs are then removed using a selective etch such as buffered HF as shown in FIG. 5h. Again, the etch proceeds to isolate suspended wire 227 and also penetrates from the sides under photoresist layer 255.

Once the photoresist is moved, the structure shown in FIG. 4 is obtained.

The third embodiment of the present invention will be explained with reference to FIGS. 6a and 6b. The third embodiment of the present invention closely resembles the second embodiment to avoid unnecessary repetition, like reference numerals will be used to denote like features. The eventual structure will be the same as that shown in FIG. 4. However, the photoresist patterns used in order to achieve this structure are varied.

Figure 6:
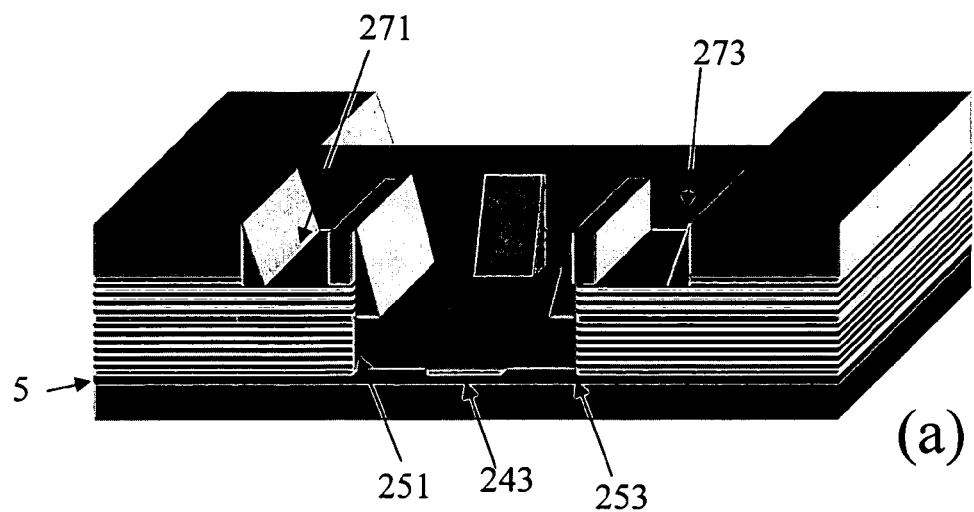
FIGS. 6a and 6b schematically illustrate selected fabrication stages for a device in accordance with a third embodiment of the present invention.
Figure 6:
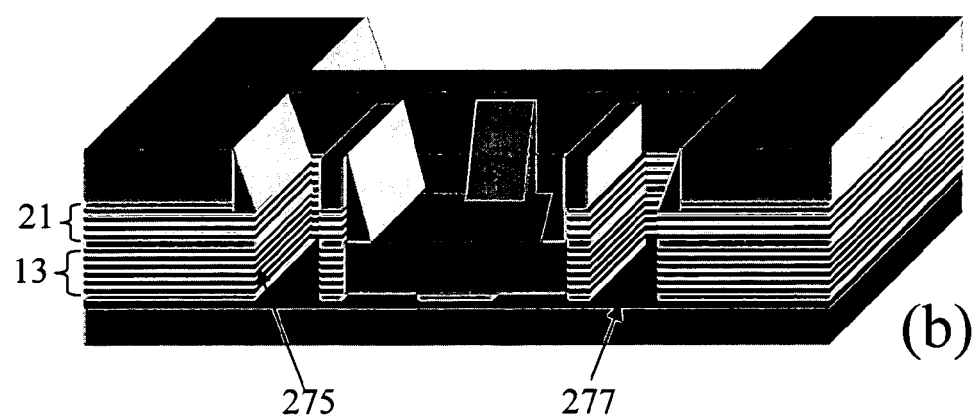

FIG. 6a is intended to be equivalent to the step shown in FIG. 5f. The steps described with reference to FIGS. 5a to 5e of the second embodiment are identical to those used for the third embodiment. Instead of exposing the edge of sidewalls 251 and 253 to the etch, these are covered with photoresist so that the very edge of these sidewalls is masked. Also, the photoresist extends considerably beyond p-type electrode 243 protecting the edges of sidewalls 251 and 253. Thus, small areas 271 and 273 of the AlAs upper layer of upper DBR 21 are exposed. These are then etched using either a dry etch or a wet etch which has not caused too much undercutting. The wet etch should be a non-selective etch and the structure is etched down to etch stop layer 5. The structure shown in FIG. 6b is produced. This structure has larger areas of the sidewalls of the upper and lower DBRs 21, 13 exposed which allows more efficient selective lateral etching of the AlAs and GaAs layers. The structure of FIG. 6 is then processed identically as described with reference to FIGS. 5g and 5h.

Figure 7:
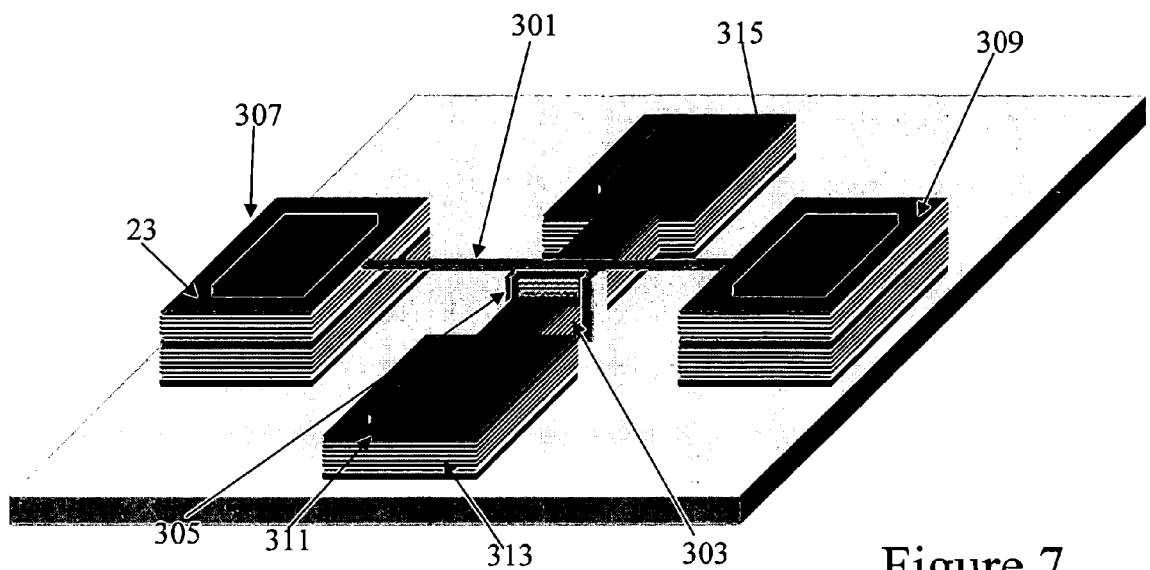
FIG. 7 schematically illustrates a device in accordance with a fourth embodiment of the present invention.

FIG. 7 schematically illustrates a device in accordance with a fourth embodiment of the present invention. In FIG. 1, a lower p-type electrode 11 was described and an optional p-type intracavity contact formed between the lower DBR mirror and the lower cavity layer 15. The fourth embodiment device utilises this layer.

As for the first to third embodiments, the device comprises two wires, an upper wire 301 and a lower wire 303 which are used to make contact to an active region 305 located at the intersection of the two wires 301 and 303 and patterned so that it has the width of the upper wire in one dimension and the width of the lower wire in the other dimension. Upper wire 301 comprises an upper n-type electrode contact layer 23 and does not comprise upper DBR 21 (FIG. 1). Upper wire 301 is connected to first and second upper contact stacks 307 and 309. Lower contact wire 303 comprises upper p-type itracavity contact electrode layer 311 and lower DBR 13. The wire 303 may also comprise lower p-type contact electrode layer 11. However, this layer may be omitted from the structure since contact is being made using upper intracavity p-type contact electrode layer 311. Lower contact region wire 303 is connected to first and second lower contact stacks 313 and 315.

Figure 8:
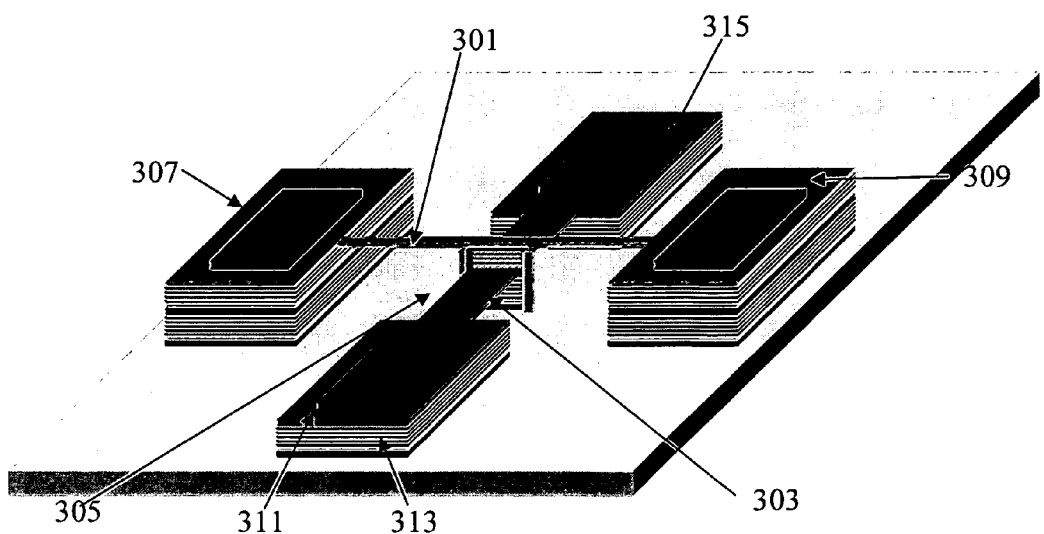
FIG. 8 schematically illustrates a device in accordance with a fifth embodiment of the present invention.
Figure 9:
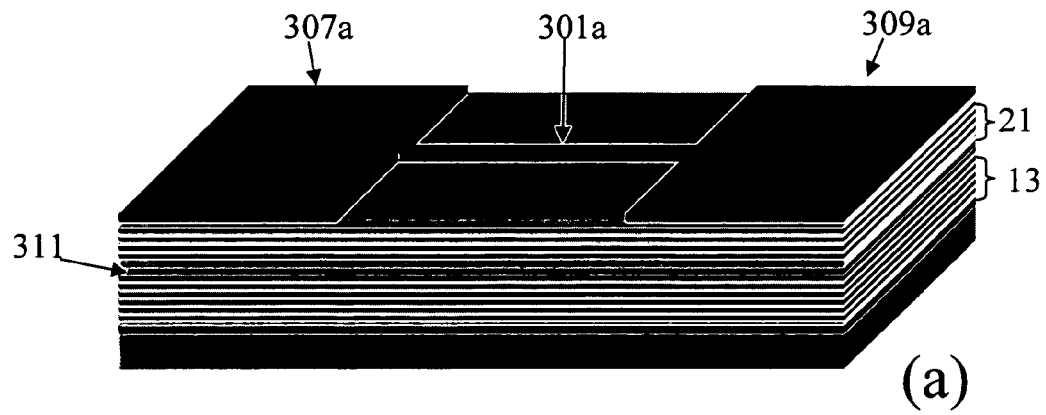
FIGS. 9a to 9g schematically illustrate fabrication stages in the device of FIG. 7 and FIG. 9h schematically illustrates a further fabrication stage in order to make the device of FIG. 8.
Figure 9:
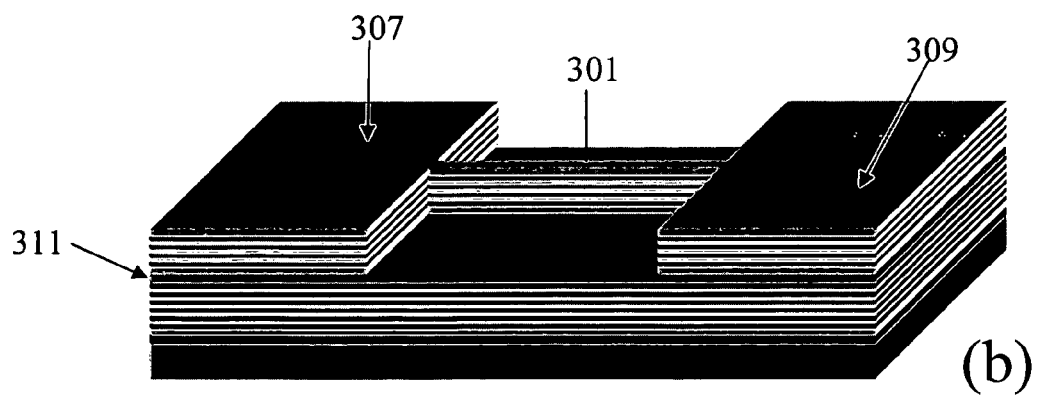
Figure 9:
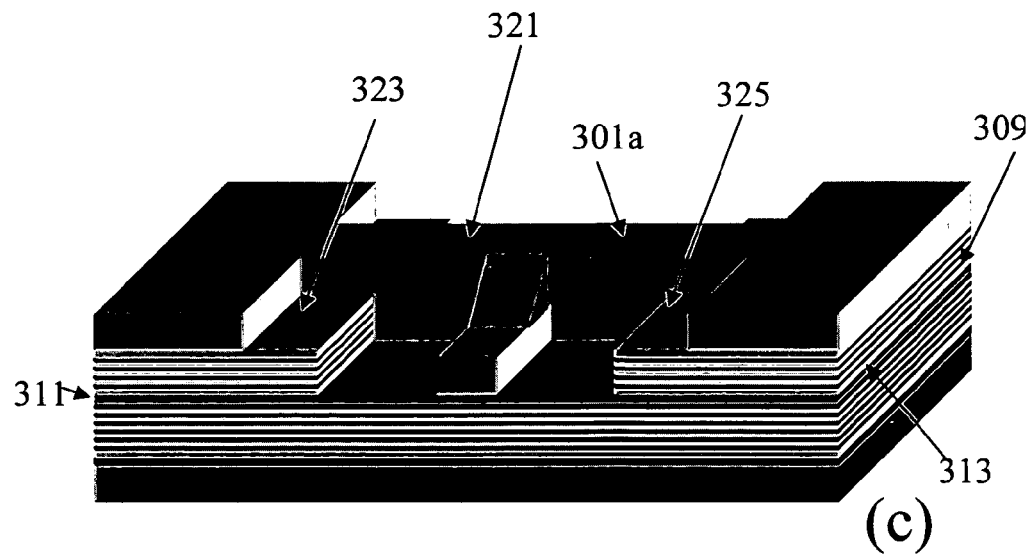
Figure 9:
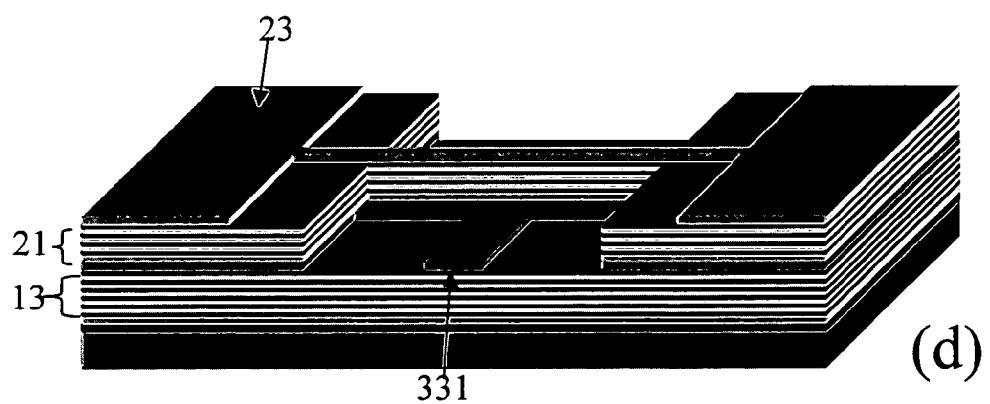
Figure 9:
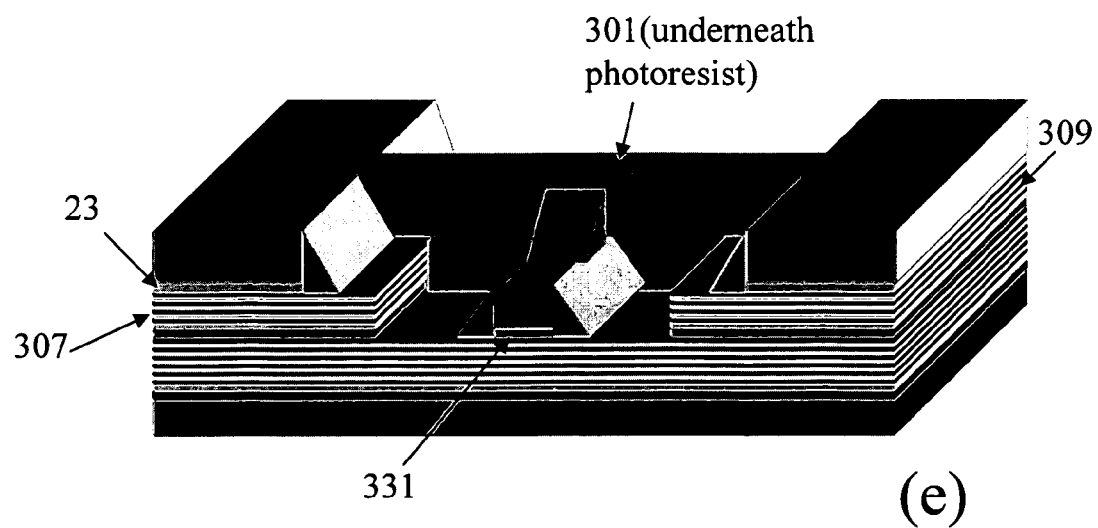
Figure 9:
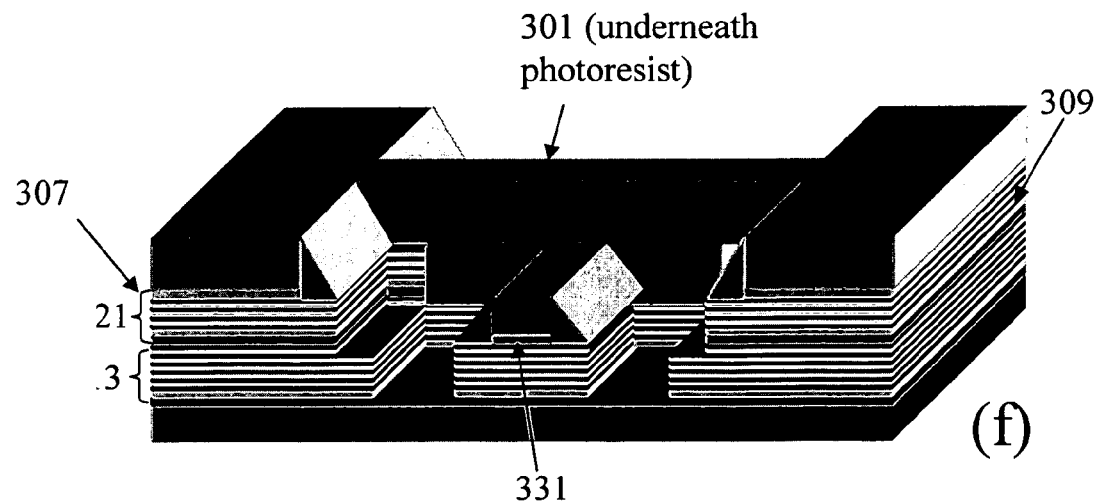
Figure 9:
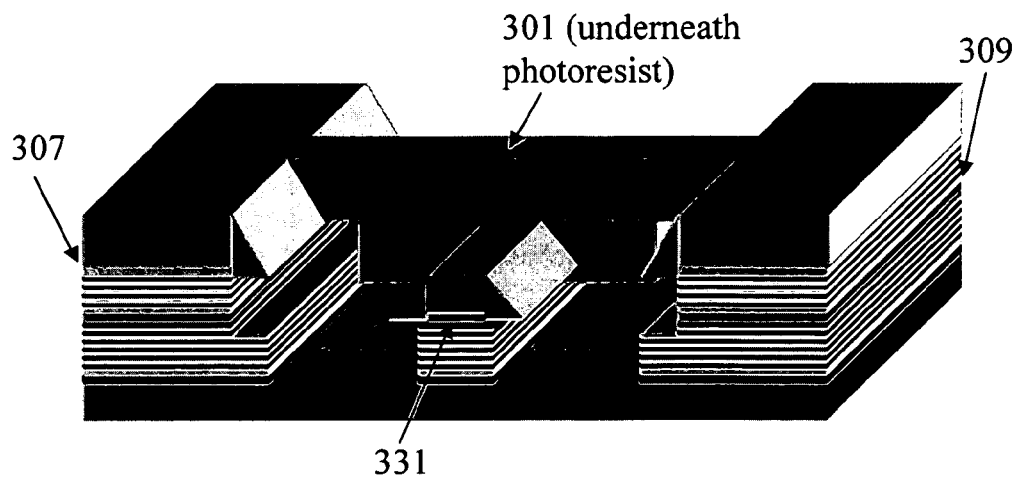
Figure 9:
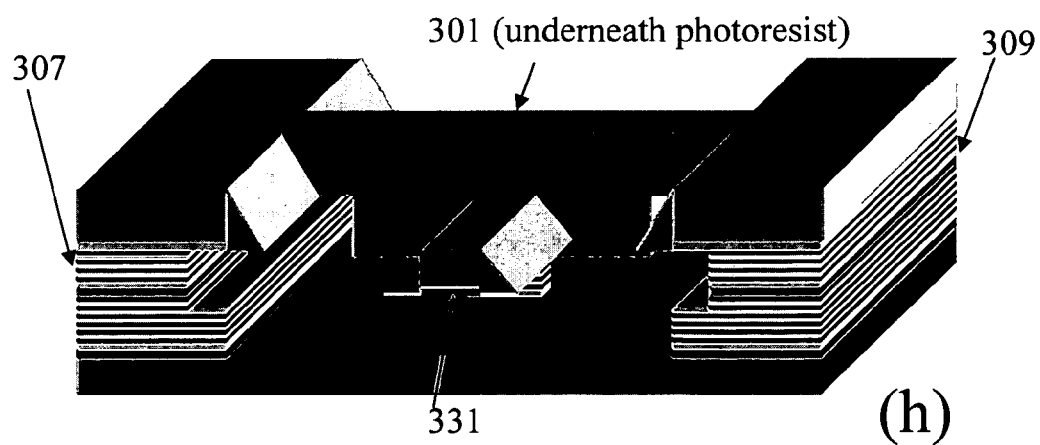

FIG. 8 schematically illustrates a device in accordance with a fifth embodiment of the present invention. The device is very similar in structure to that of FIG. 7. Therefore, to avoid unnecessary repetition, like reference numerals will be used to denote like features. The upper contact layer 301 is identical to that described with reference to FIG. 7. However, lower contact wire 303 only comprises upper p-type contact layer 311. Lower DBR 13 is etched from underneath this layer except for the region where upper wire 301 and lower wire 303 intersect.

The fabrication of the devices of both the fourth and fifth embodiments of the present invention is very similar and will be described with reference to FIGS. 9a to 9h In FIG. 9a, a thin layer of photoresist is spun and patterned on the upper layer of the structure of FIG. 1 (including an upper intracavity p-type electrode layer 311) to form a thin wire of photoresist 301a bridging a first contact region stack 307a and a second contact region stack 309a.

The structure of FIG. 9a is then etched down into or stopped on the intracavity p-type GaAs electrode layer 311. The structure is etched using a dry etching technique or a wet etching technique where there is little undercut. The photoresist is removed to leave wire 301 and contact stacks 307 and 309 connected to wire 301. Wire 301 and contact stack 307 and 309 comprise all of the layers shown in the structure of FIG. 1 down to into intracavity p-type electrode layer 311.

Next, n-type and p-type contacts are fabricated as described with reference to FIG. 3c. The final position of these contacts is shown in FIGS. 7 and 8.

In FIG. 9c, a photoresist layer 321 is formed over the structure of FIG. 9b with contacts. The photoresist layer 321 patterns upper n-type electrode layer 23 such that it is recessed from the inner edges of masks contact regions 323 and 325 on contact stacks 307 and 309 and also upper-wire 301. The photoresist also masks part of the intracavity electrode layer 311 in order to allow definition of the lower wire 303 of FIGS. 7 and 8.

The structure is then etched with a selective GaAs etch such that the upper AlAs DBR layer of the upper DBR 21 and the upper AlAs layer of the lower DBR 13 acts as etch stops. The structure after removing the photoresist is FIG. 9d. Alternatively, the structure may be just carefully etched using a non-selective wet etch or a dry etch.

Once the upper contact layer 23 and the intracavity contact layer 311 have been patterned, a thick layer of photoresist is then formed masking the regions of the upper-n-type contact layer 23 which have just been patterned on contact stacks 307 and 309 and also the patterned intracavity contact 331 as shown in FIG. 9e.

Next, the structure of FIG. 9e is etched using either a dry etch or a non-selective wet etch which does not undercut the photoresist too much in order to pattern the lower DBR 13. The etch is taken down at its lowest point to isolate lower patterned p-type contact 331, The resultant structure with the photoresist on is shown in FIG. 9f.

In the step shown in FIG. 9g, two separate selective wet chemical etch processes are performed, one to selectively remove the GaAs and the other to selectively remove AlAs. Details of these processes have been previously discussed. The selective etch then undercuts part of upper contact wire 301 to form a freestanding bridge.

For the device of FIG. 7, the structure is finished in step 9g. However, to fabricate the device of FIG. 8, it also necessary to remove the lower DBR from underneath part of the lower patterned contact layer 331. This may be done by prolonging the selective etch steps explained with reference to FIG. 9g. Thus, the lower DBR 13 just remains underneath the intersection of the upper contact wire and lower intracavity layer 331 and underneath the first and second contact stacks 307 and 309 and also underneath the first and second lower wire contact stacks 313 and 315 (not shown in FIG. 9 but shown in FIGS. 7 and 8).

Figure 10:
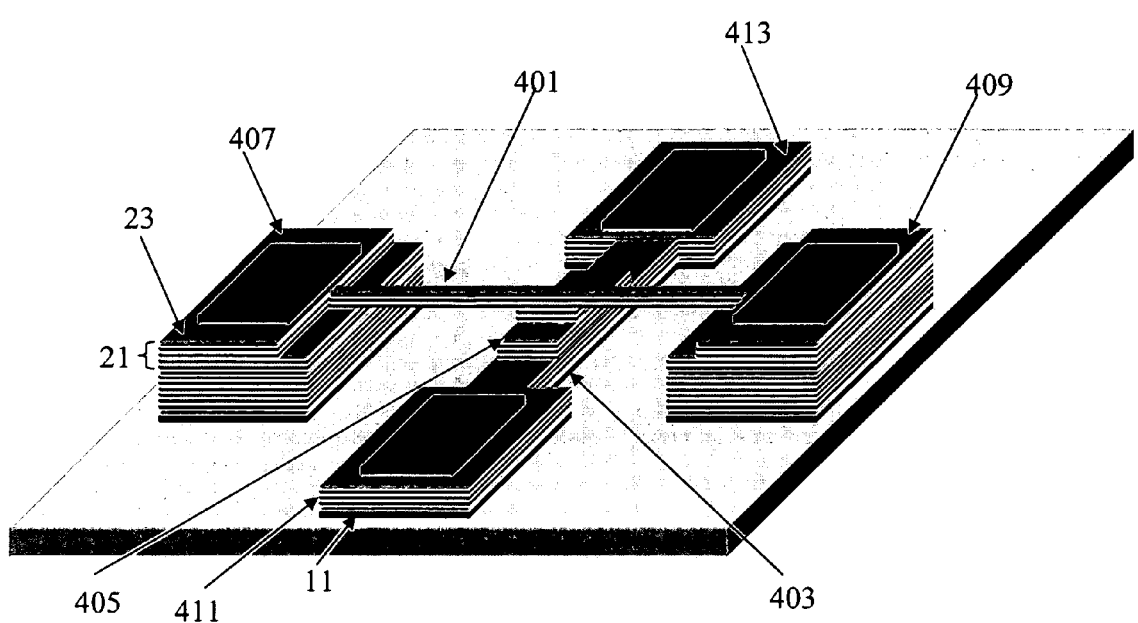
FIG. 10 is a device in accordance with a sixth embodiment of the present invention.
Figure 11:
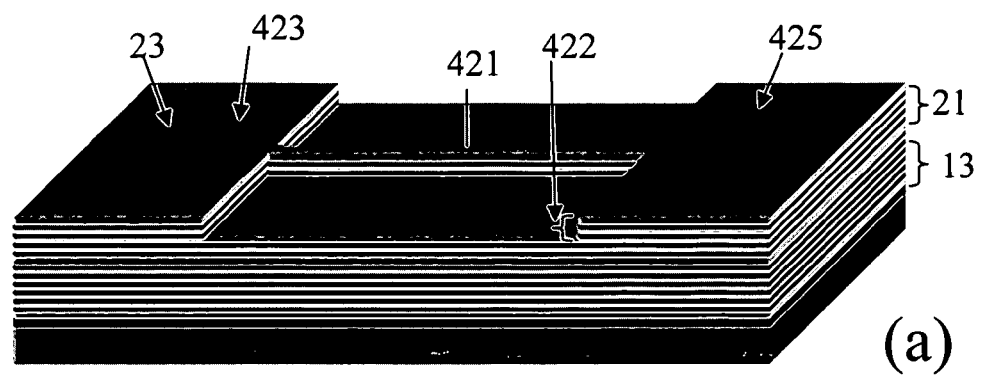
FIGS. 11a to 11f are fabrication stages required for the device of FIG. 10.
Figure 11:
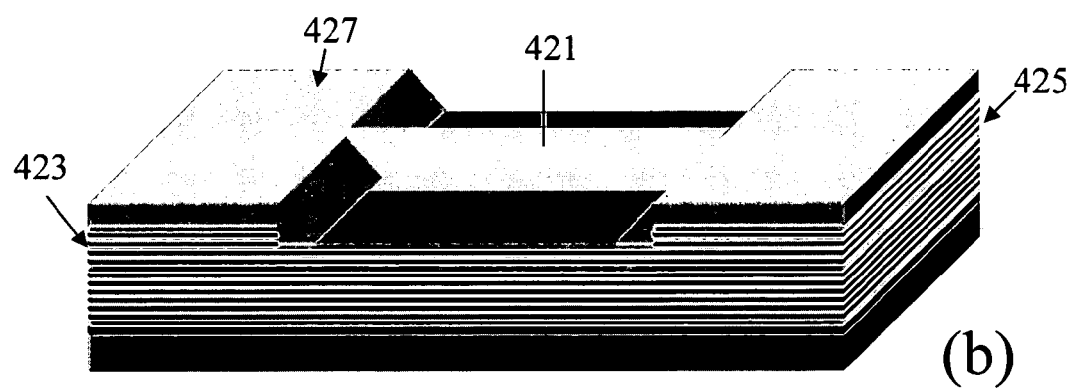
Figure 11:
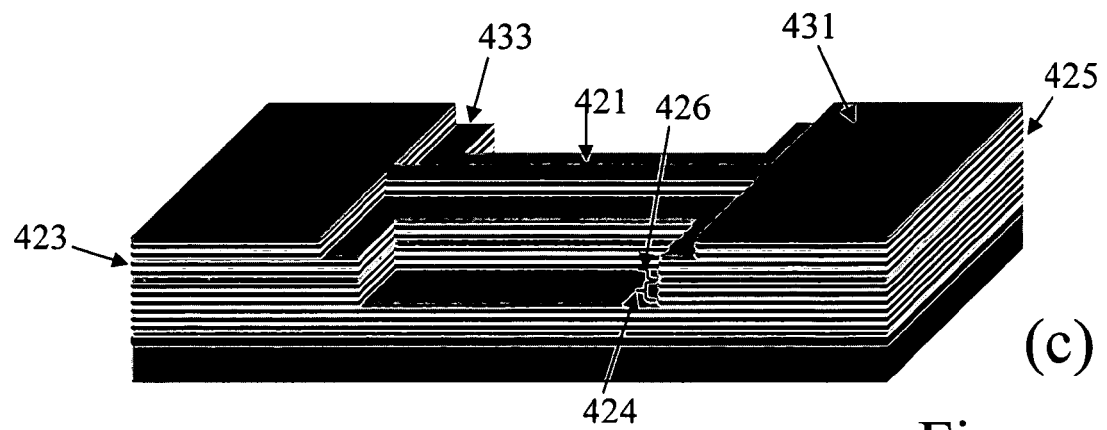
Figure 11:
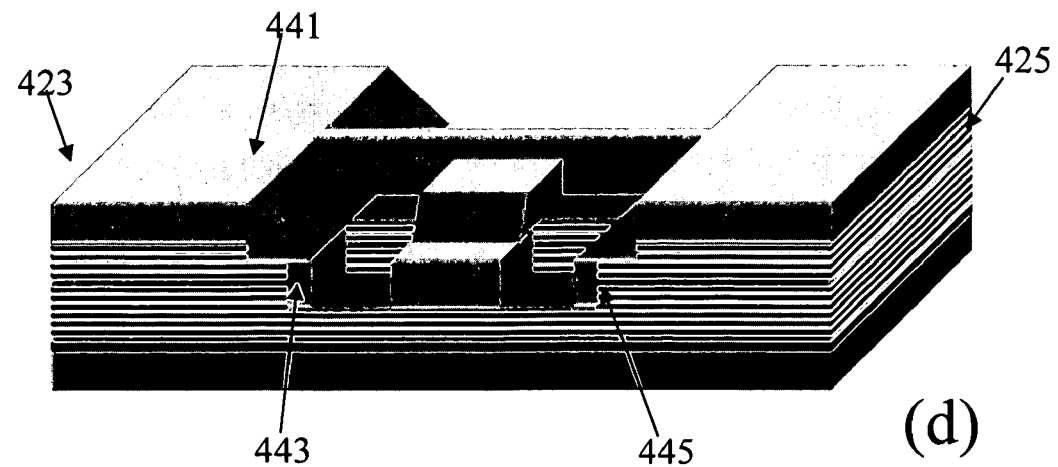
Figure 11:
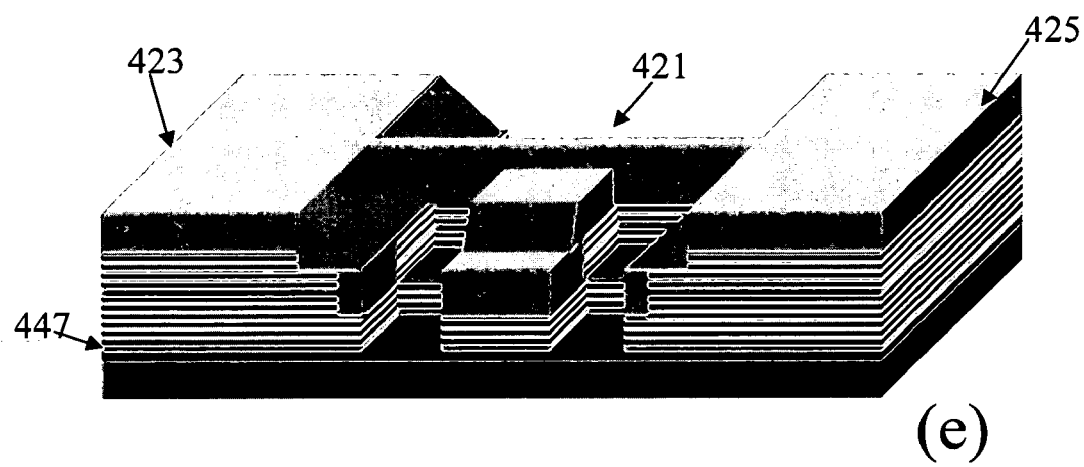
Figure 11:
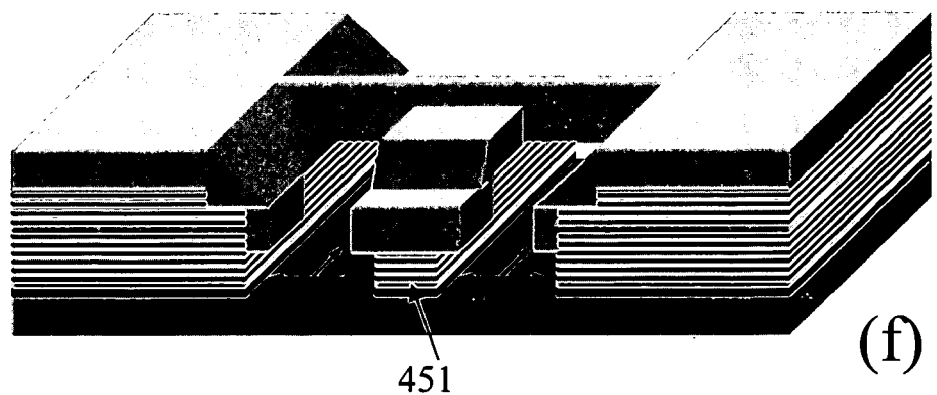

FIG. 10 schematically illustrates a device in accordance with a sixth embodiment of the present invention. The device again comprise a first upper wire 401 which is arranged perpendicular to a second lower wire 40. A terraced active region 405 is provided at the intersection of the two wires formed from the lower layers of the upper DBR 21. The upper wire 401 is connected at either end to first and second upper contact stacks 407 and 409. The lower wire 403 at either end is connected to first and second lower wire contact stacks 411 and 413. The upper wire comprises upper contact layer 23 (FIG. 9) and at least one period from upper DBR 21. The lower wire 403 comprises lower DBR 13 and lower contact layer 11. At the intersection of the upper wire 401 and the lower wire 403, the upper DBR 21 is terraced. In the upper wire contact stacks 407 and 409, the upper DBR is also terraced The fabrication of the device of FIG. 10 will be described with reference to FIGS. 11a to 11f. First, photoresist is spun and patterned on to the device in order to define a wire with two contact pads as described with reference to FIG. 3a. The resulting structure is then etched using either a dry etch or a wet non-selective etch which does not cause substantial undercutting. The etch is stopped partway into the top n-type DBR 21 etching upper layers 422 of upper DBR 23. The etch defines a narrow wire 421 formed of from the upper few layers 42 part of the top of upper n-type DBR 21 and conducting layer 421 n-type electrode layer 23 which is connected at either end to upper wire contacts stacks 423 and 425.

Next, a thick layer of photoresist is spun and patterned onto the structure to mask both the top surfaces and the side surfaces of wire 421 and contact stacks 423 and 425. A second etch is then performed. This second etch is preferably a dry etch or maybe a non-selective wet etch which does not cause substantial undercutting. The second etch extends down midway into the bottom p-type DBR 13, thus etching the upper layers 424 of lower DBR 13. The resultant terraced structure is shown in FIG. 11c. Here, it can be seen that there is a first upper terrace 431 is formed from upper n-type electrode 423 and upper layers 422 of upper DBR 21. The first terrace is in the shape of a wire connecting two contact stacks. The second terrace 433 comprises lower layers 426 of upper DBR 21, the active region 20 and upper layers 424 of lower DBR 13. The second terrace 433 is in the shape of the first terrace 431, but the wire 421 is wider in the second terrace then the first terrace and the contact stacks 423 and 425 extend further inwards in the second terrace on the structure between layer 421 and contact stacks 423 and 425 and a second terrace 433 which extends slightly beyond the above terrace.

Next, p-type and n-type contacts are formed as described with reference to FIG. 3c. The position of these contacts can be seen in FIG. 10.

A thick layer of photoresist 441 is then spun over the resulting structure as shown in FIG. 11d. The photoresist is patterned so that it protects the whole of the upper terrace 431 and its sides and also the sides 443 and 445 of the second terrace of the contact stacks 423 and 425. The edges of the wire 421 in the second terrace 433 are left exposed to allow etching of these layers later. The sides of second terrace 433 are exposed to allow the etch to undercut the structure. The photoresist also covers the p-type contact (not shown) and defines the lower p-type wire.

The resulting structure is then etched using either a non-selective wet etch which does not cause substantial undercutting or is etched by a dry etch. The etch progresses down to isolate bottom p-type DBR 13 and p-type GaAs electrode 11 as shown in FIG. 11e. The etch essentially defines a third tier 447. In the third tier, the sidewalls of the lower layers 426 of lower DBR 13 contact stacks 423 and 425 are exposed and also further side walls of the lower wire and upper wire. The third tier 447 extends beyond second tier 433 and also defines lower wire 451.

The structure is then etched using a selective etch to first remove the GaAs and then the remaining AlAs. The results of this etch is shown in FIG. 11f. This results in undercutting of complete removal of the third 447 and second 433 terraces which underlie the wire 421 except where the upper wire 421 overlies the lower wire 451 leaving the top terrace of wire 421 suspended above lower wire 451.

The second terrace 433 extends partially along lower wire 451 to form terraced region 405 of FIG. 10 which comprises the active region.

Figure 12:
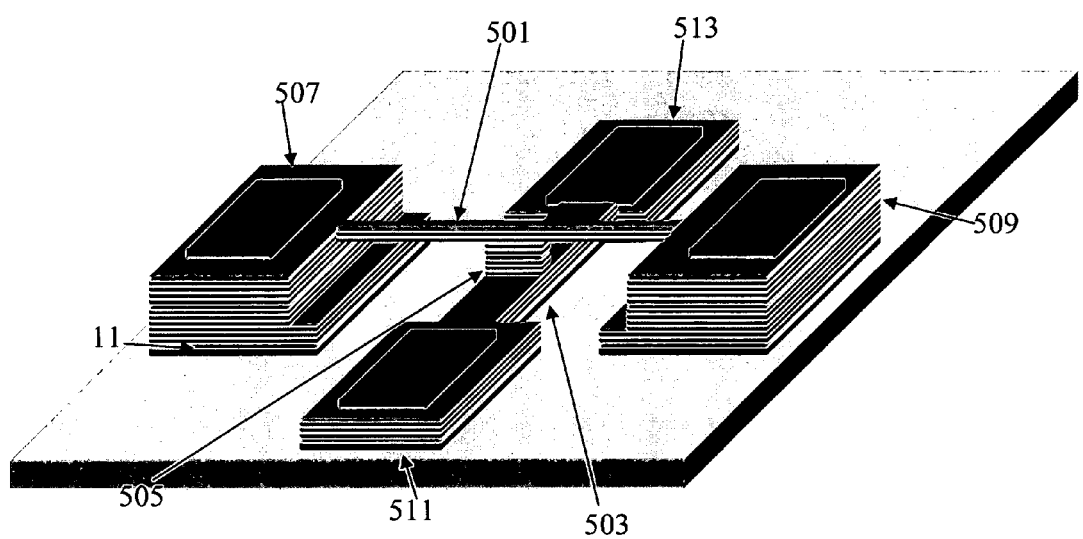
FIG. 12 is a schematic of a device in accordance with a seventh embodiment of the present invention.
Figure 13:
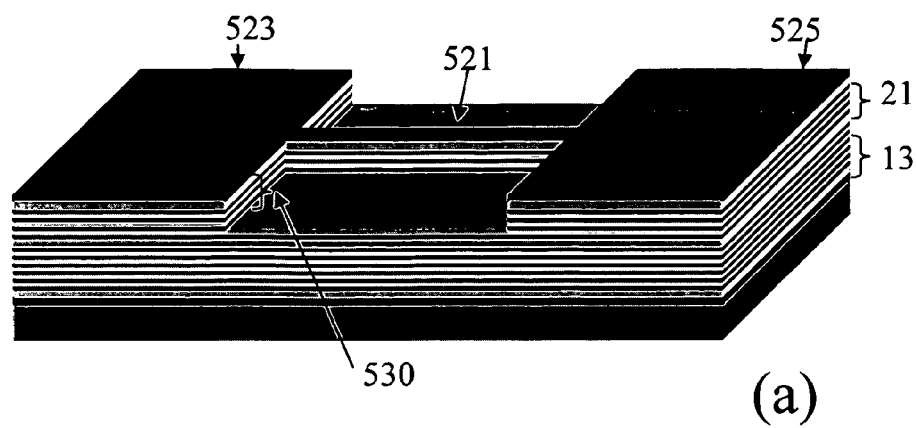
FIGS. 13a to 13e are fabrication stages for the device of FIG. 12.
Figure 13:
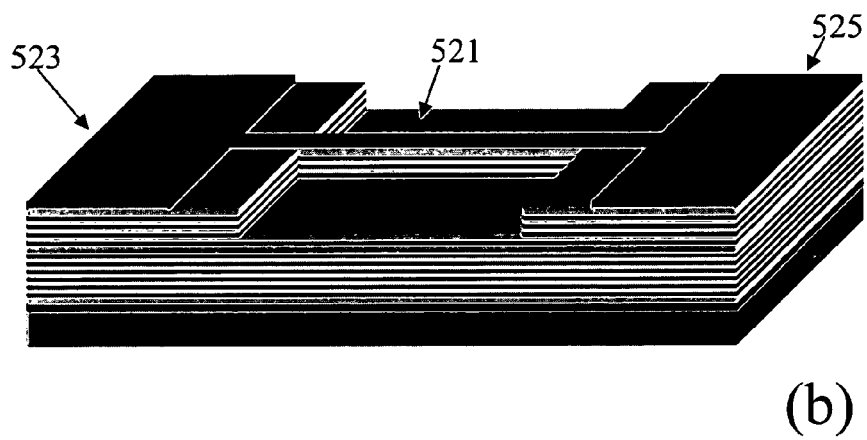
Figure 13:
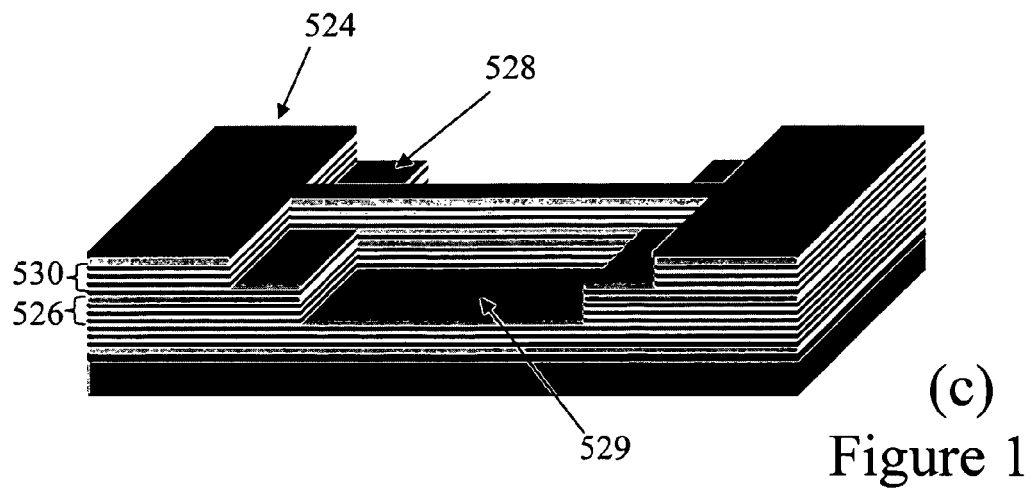
Figure 13:
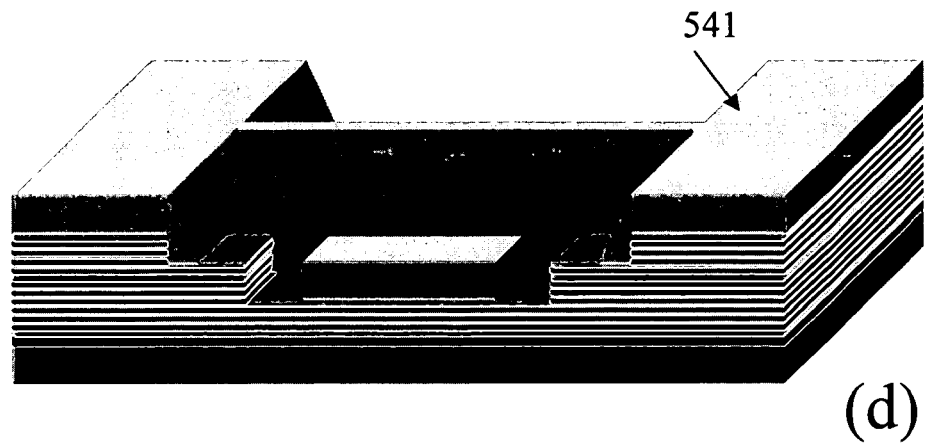
Figure 13:
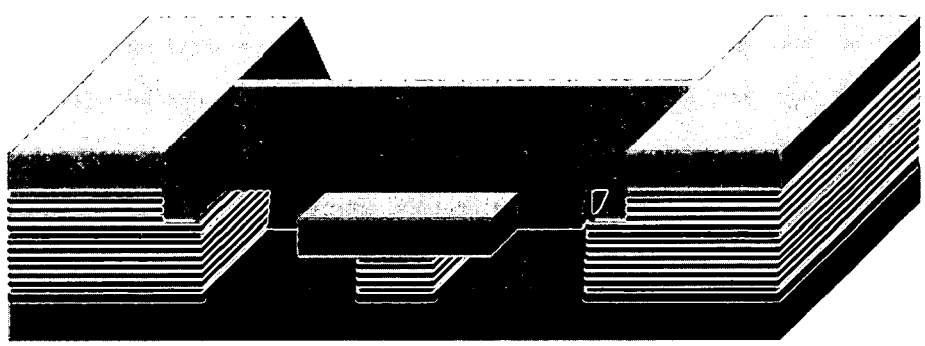

FIG. 12 schematically illustrates a device in accordance with a seventh embodiment of the present invention. Similar to the sixth embodiment, the device has an upper contact wire 501 arranged perpendicular to a lower contact wire 503. The active region 505 is provided as a narrow pillar at the intersection of these two wires. Upper wire 501 is connected to first and second contact stacks 507 and 509. Lower wire 503 is connected to first and second lower contact stacks 511 and 513. Upper wire 501 comprises top contact layer 23 (FIG. 1) and at least one repeat of DBR 21. Lower contact wire 503 comprises lower contact layer 11 and at least one repeat of lower DBR 13. The active region 505 is not terraced and lies between the two wires, and comprises part of upper DBR 21, cavity layers 15 to 19 and part of lower DBR 13.

There is no terracing on active region 505 or lower wire 503. However, a lower terrace is formed in lower DBR 11 of contact stacks 507 and 509.

The fabrication of the device of FIG. 12 will be described with reference to FIGS. 13a to 13e.

As explained for the previous devices, the first step is to define a thin wire 521 which joins two contact pads 523 and 525 in FIG. 13a. This pattern is defined using photolithography and is then etched using either a dry etch or a non-selective wet etch which does not cause substantial undercutting. The etch is stopped partway within the upper n-type DBR 21 etching upper layers 530 of upper DBR 21.

The photoresist in FIG. 13a remains after etching and is re-exposed to remove the photoresist from the edges of the contact stacks 523 and 525 as shown in FIG. 13b. The structure is then etched using either dry etching or a non-selective wet etch which does not cause too much undercutting such that the bottom of the etch is taken down to within the lower DBR 13 such that the upper layer 526 of lower DBR 13 are etched. Thus, an upper terrace 524 is formed comprising upper n-type electrode 23 and upper layers 530 of upper DBR 21. The upper terrace is shaped as a wire 521 connecting two contact stacks 523 and 525. The second terrace 528 comprises two lowest layers 530 of upper DBR 21, the active region 20 and upper layers 526 of lower DBR 13. The second terrace 528 has the same shape as first terrace 524 but extends inwards from the contact stacks 523 and 525 which stops within the upper DBR 21. A lower slightly larger terrace is formed 529 which stops within lower DBR 13.

This is shown in FIG. 13c. In this figure, it can be seen that terrace defining step in FIG. 13b is further etched to form the third terrace 529 and the first terrace is formed by unmasking regions of the previously unetched structure. This is in contrast to embodiment six where the first terrace is formed and this terrace is completely covered and the structure is etched in order to form the second terrace.

Next, n-type and p-type contacts are formed as described with reference to FIG. 3c. The position of these contacts can be seen in FIG. 12.

Next, the structure is covered with a thick layer of photoresist 541 as shown in FIG. 13d. This thick layer of photoresist covers the whole of the first terrace 524 and the sides of the first terrace and also covers the sides of the wire 521 which form part of extends into the second terrace 528.

The structure is then etched using either a dry etching system or a non-selective wet etch which does not cause substantially undercutting. The etch proceeds down to either the lowest GaAs layer of the lower DBR 13 or the n-type electrode layer 11.

Then, the structure is selectively etched using an etch which attacks GaAs and then an etch which attacks AlAs. This etch undercuts wire 521 to provide the device as shown in FIG. 13e. The photoresist is then removed to produce the device of FIG. 12.

In all of the above structures, any exposed sides of the active region or DBR adjoining the active region may be passivated, either by application of a passivation layer or by oxidation as explained with reference to FIGS. 3a to 3h.

FIGS. 14a to 14g schematically illustrate fabrication steps for manufacturing a device in accordance with a further preferred embodiment of the present invention. In this device, the active area is formed in a pillar which is surrounded by an insulator allowing a large area contact to be formed to the top of the pillar.

The basic layer structure of the device is illustrated in FIG. 14a. The structure is similar to that of FIG. 1 having a GaAs buffer layer formed on a semi-insulating substrate 601. A p-type electrode comprising p-doped Gas 603 is then formed overlying and in contact with said buffer layer and substrate 601.

A lower p-doped Bragg mirror 605 is then formed overlying and in contact with said lower p-type electrode 603. Said p-type Bragg mirror is formed in the same manner and with the same considerations as the lower p-type Bragg mirror 13 of FIG. 1.

Intracavity p-type electrode 607 is formed from p-doped GaAs and is formed overlying and in contact with lower Bragg mirror 605. Intrinsic cavity region 609 is then formed overlying and in contact with said intracavity electrode 607. The intrinsic cavity region 609 is similar to cavity region 20 of FIG. 1 and comprises a layer of InAs quantum dots formed between two layers of intrinsic GaAs. For further details of these layers please refer to the explanation accompanying FIG. 1.

Upper n-type Bragg mirror 613 is then formed overlying and in contact with the intrinsic cavity region 609. Upper n-type Bragg mirror 613 is fabricated in the same manner and with the same considerations as upper Bragg mirror 21 of FIG. 1. Finally, the structure is finished with an n-GaAs electrode 515 formed overlying and in contact with upper Bragg mirror 613. A thin layer of n-InAs may be overgrown (not shown in the figure) for better electrical ohmic contact quality.

Next, the structure is patterned and etched down to intracavity p-type electrode layer 607 leaving a narrow pillar of layers 617 containing the cavity region 609. The pillar 617 is formed using either a dry etching technique such as reactive ion etching or a wet etching technique which does not cause undercutting. The pillar is approximately circular in cross section and has a diameter of 1 to 2.5 µm, preferably 2 µm.

In FIG. 14b, the etch is stopped in the intracavity p-type layer 607, but could also be stopped in the lower Bragg mirror 605 or bottom p-type electrode 603.

In FIG. 14c a p-type ohmic contact 619 is formed using a standard lift-off process is made to the intracavity p-type electrode. The contact is formed using a standard p-type metal contact such a AuBe. As before, other alloys maybe used e.g. AuZn.

In FIG. 14d, a thick insulator 621, e.g. polyimide is deposited and patterned over the pillar 617 of FIG. 14c. The thick insulator is thicker than the height of pillar 617 such that pillar 617 is completely submerged in the insulator 621.

Insulator 621 left surrounding the pillar 617 is anisotropically etched or recessed by reactive ion etching down to the level of the top of the pillar 617 to expose the top of the pillar.

Next, a transparent ohmic contact 623 is formed by a lift off process to make contact to the top of the pillar 617 as shown in FIG. 14f. The contact 623 is fabricated from indium tin oxide or the like.

Finally, a large area metal contact 625 is made to transparent contact 623. The large area contact is kept away from the top of the pillar 617 so that it does not obscure light entering or being emitted from the pillar 617.

Other optional steps not explicitly depicted that can improve the device performance may be adopted e.g. an isolation etch into the semi-insulating GaAs substrate such that contact 625 and another large area contact to contact 619 may be made on it. Also the sequence of some of these steps may be interchangeable e.g. the patterning of the thick insulator 621 as shown in FIGS. 14d and 14e may be done before the formation of the p-type ohmic contact in FIG. 14c.

FIGS. 15a to 15f schematically illustrate a variation on the fabrication method of FIGS. 14a to 14g. Here, a protective layer is provided over the top of pillar 617 during processing in order to protect the top surface of mesa pillar 617.

The basic layer store is the same as that described with reference to FIG. 14a. Therefore, to avoid unnecessary repetition, like reference numerals will be used to denote like features.

Figure 15:
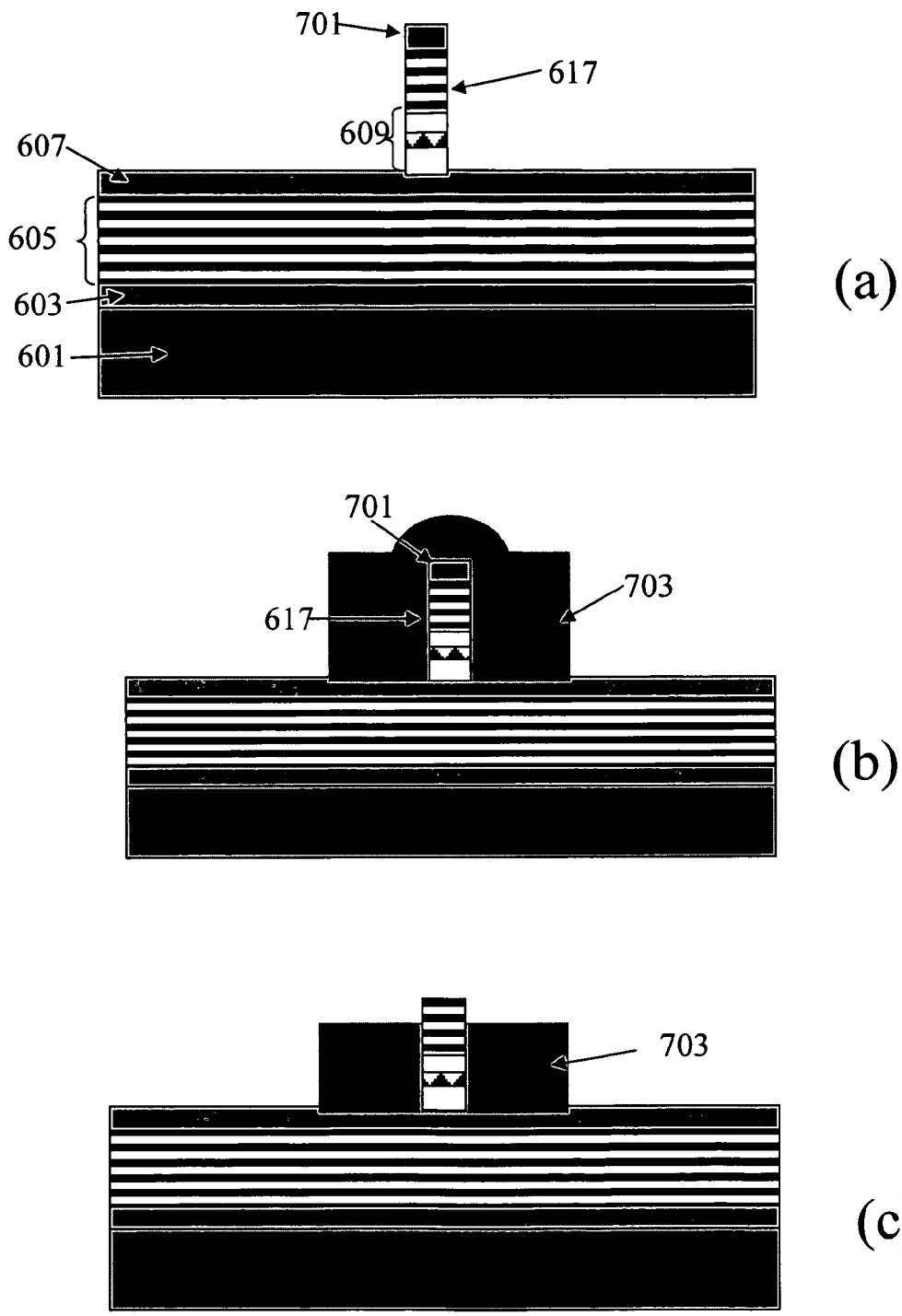
FIGS. 15a to 15f schematically illustrate fabrication stages for a device in accordance with a further embodiment of the present invention.
Figure 15:
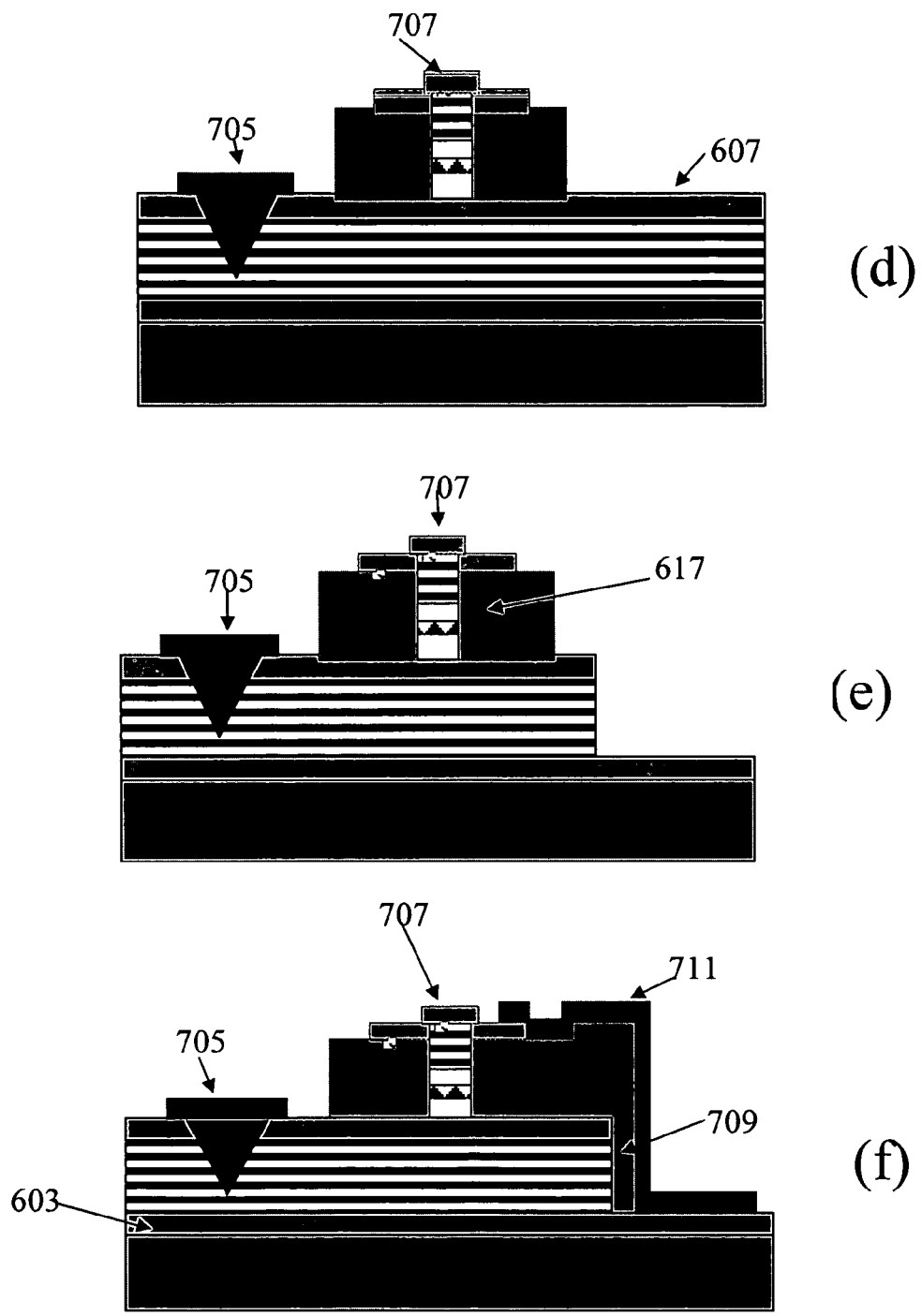

Please note, that n-GaAs electrode layer 615 is not shown in FIG. 15. This layer may be present on top of upper n-type upper Bragg mirror 613 or may be omitted if upper Bragg mirror 613 is configured such that is it possible to make a good ohmic contact to the mirror, for example, if the doping of upper Bragg mirror 613 is sufficient.

In FIG. 15a, a 1 to 2 μm diameter mesa is defined by reactive ion etching. The mesa may be formed in the same way as described with reference to FIG. 14b. A protective layer 701 is provided on top of mesa 617.

In this particular example, layer 701 is the photoresist initially used to pattern the wafer in order to define mesa 617. In the fabrication steps described with reference to FIG. 14, this photoresist is removed from the top of pillar 617 prior to applying the insulator. In the fabrication method of FIG. 15, this photoresist is left on the top of the pillar and is present throughout the whole fabrication.

The layer 701 does not have to be photoresist an may be a different type of protective layer which is provided on the wafer prior to spinning-on photoresist 701 to define mesa 617.

Protective layer 701 is provided in order to protect the surface of pillar 617. The material may be any type of material which can be easily removed from the top of pillar 617 and which also does not substantially degrade during the processing of the device.

The etching of pillar mesa 617 extends down into p-type layer 607. However, the etch may also extend into the lower Bragg mirror 605 if this stack is p-doped.

A thick insulator 703 is then spun over mesa 617 and protective film 701. In theory, a relatively thick insulator should provide nearly flat coverage over mesa 617. However, in reality, this is often not the case due to the relatively high aspect ratio of pillar 617.

The insulator 703 is then recessed as shown in FIG. 15c in order to expose the top of mesa 617. Photoresist layer 701 is then easily removed by an appropriate solvent after recessing has taken place. Thus, the top of pillar 617 is protected during recessing.

P-type contact 705 and n-type contact 707 are then made to lower p-type layer 607 and the top of mesa 617 respectively. The two contacts 705, 707 are Ohmic contacts and are deposited using the standard lift-off technique are annealed into the respective epilayers as shown in FIG. 15d. The n-type contact is a transparent contact in order to allow the emission of radiation from the top of the pillar 617.

Next, as shown in FIG. 15e, an isolation etch is performed on lower p-type layer 607 and lower Bragg mirror 605 to remove these layers down to layer 603.

A secondary insulator coat 709 is then provided to the structure in order to fully isolate subsequent metal contacts from lower Bragg mirror 605 as shown in FIG. 15f.

Next, contact metal 711 is provided to both the upper end type contact 707 and the lower p-type contact 705. The contact metal 711 connecting to the upper n-type contact 707 is shown extending over the isolation etch and secondary isolation 709. The mesa preferably has a diameter of 2 μm.

The insulators may be polyimide as described with reference to FIG. 14.

As before the sequence of some of these steps may be interchangeable e.g. the patterning of the thick insulator 703 as shown in FIG. 15b may be done after the formation of the p-type ohmic contact 705 in FIG. 15d.

Figure 14:
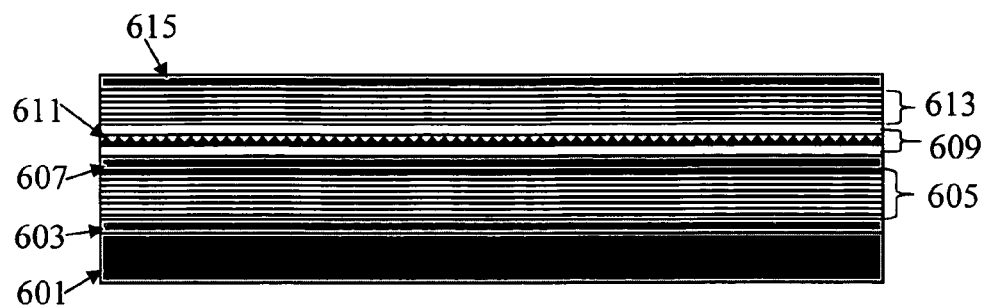
FIGS. 14a to 14g schematically illustrate further fabrication stages for a device in accordance with a further embodiment of the present invention.
Figure 14:
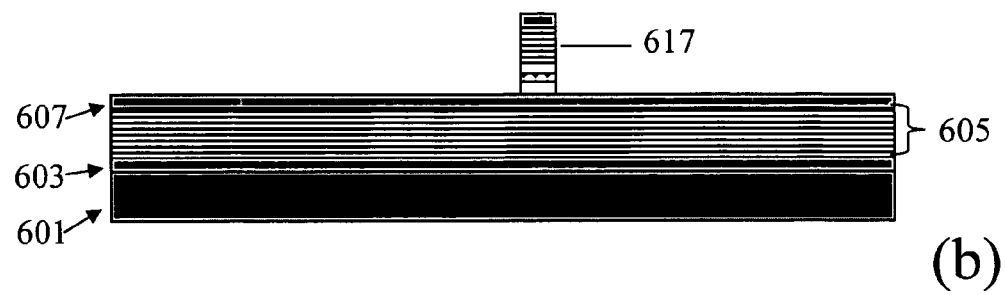
Figure 14:
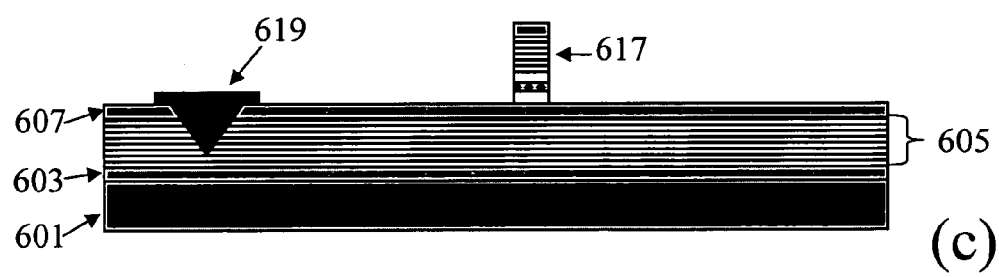
Figure 14:
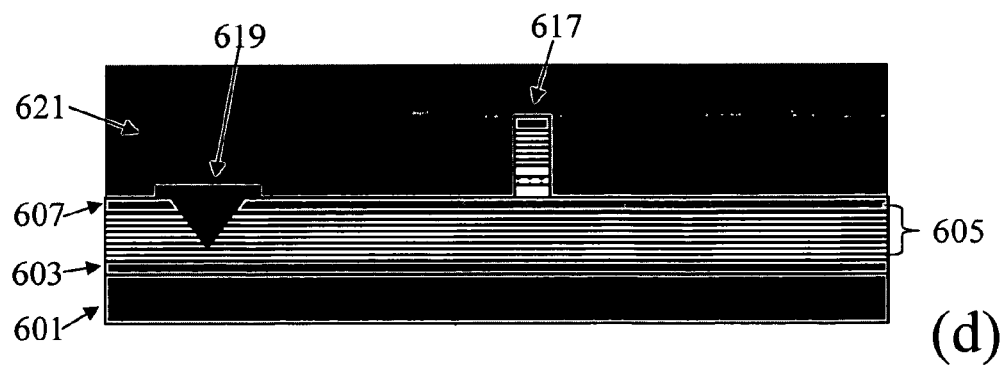
Figure 14:
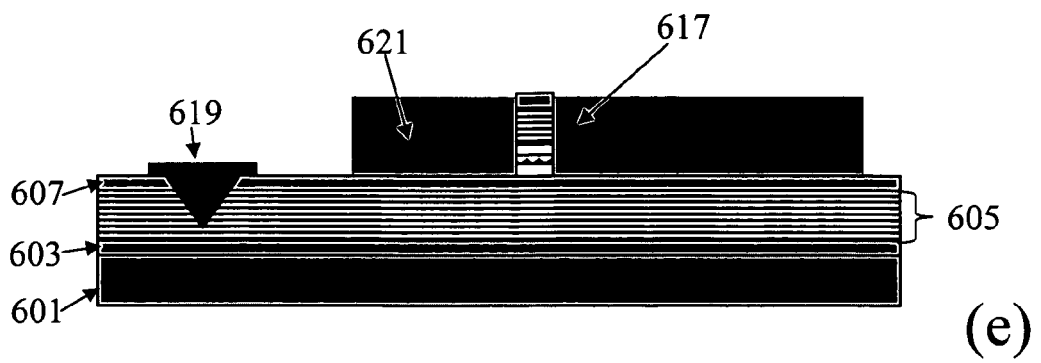
Figure 14:
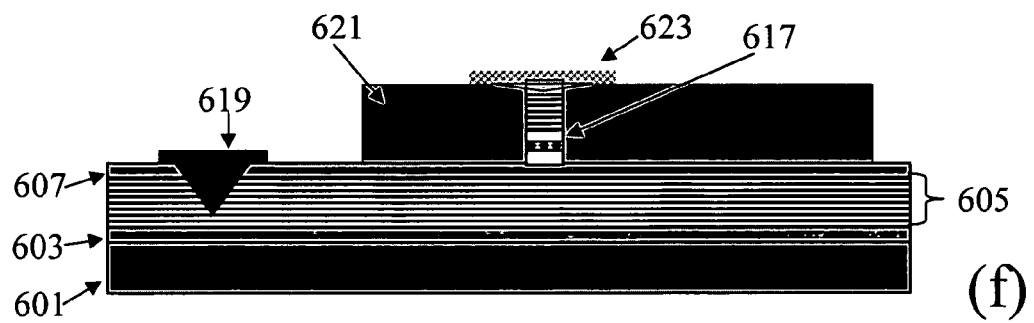
Figure 14:
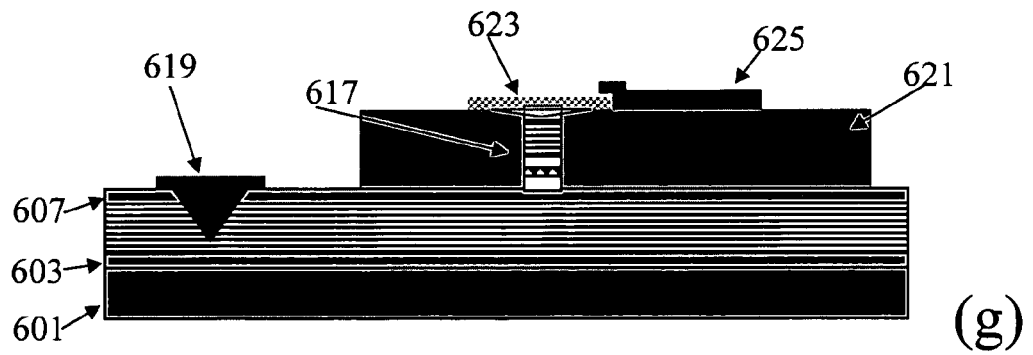

FIGS. 16a to 16e show a further variation on the fabrication method of FIG. 14. Here, the insulator is applied using evaporation.

The basic layer structure is almost identical to that described with reference to FIG. 14a. Therefore, to avoid unnecessary repetition, like reference numerals will be used denote like features.

Figure 16:
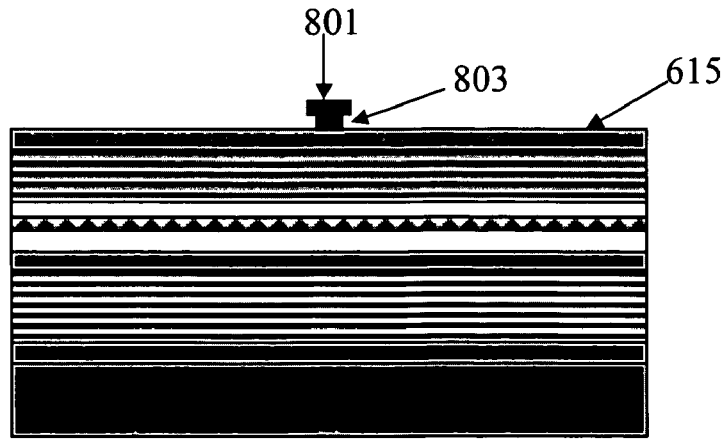
FIGS. 16a to 16e schematically illustrate a further fabrication method for a device in accordance with an embodiment of the present invention.
Figure 16:
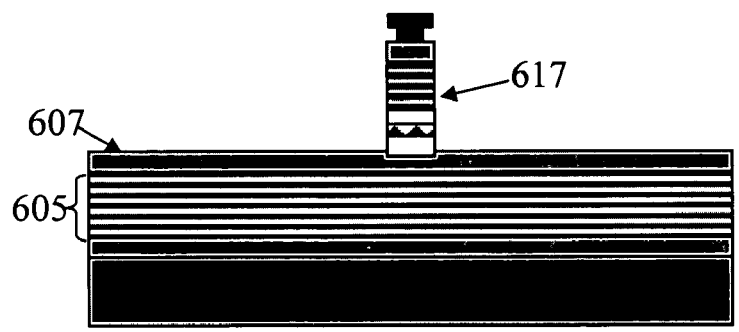
Figure 16:
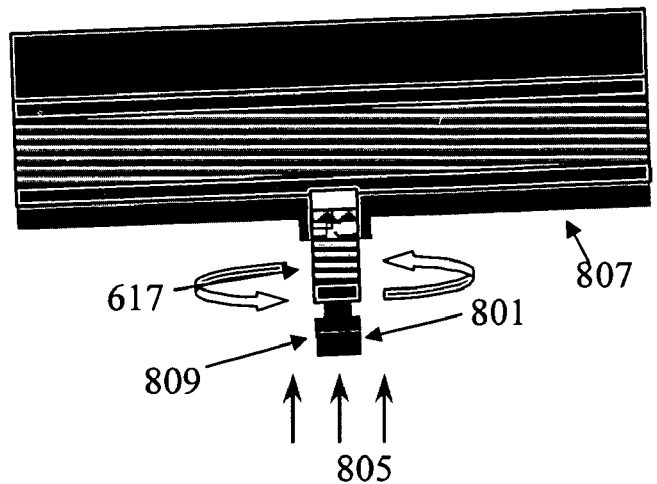
Figure 16:
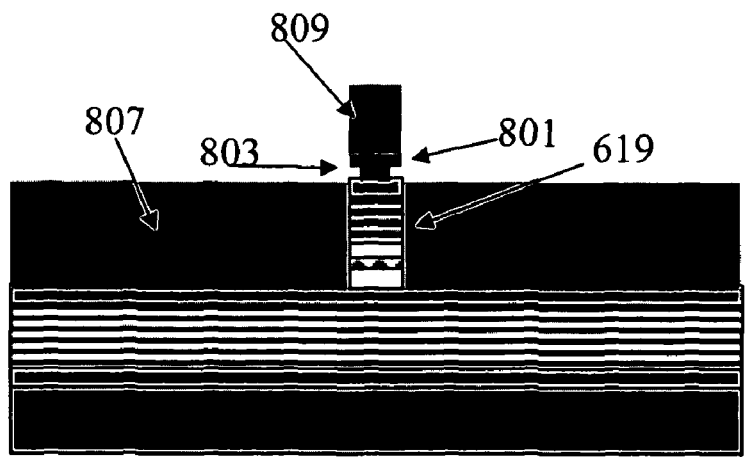
Figure 16:
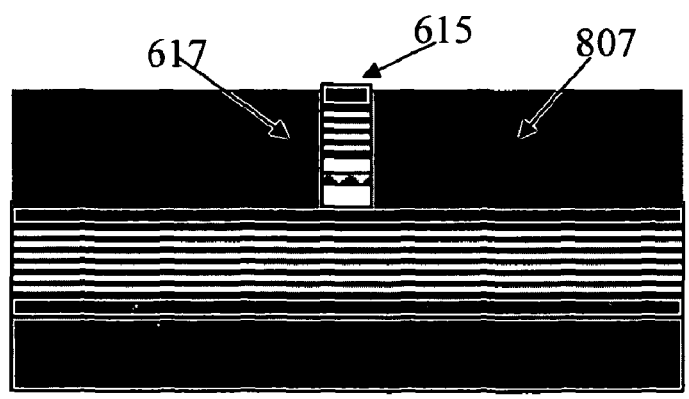

In FIG. 16a, photoresist 801 is provided on upper n-type layer 615 and is patterned in the standard way. The photoresist is patterned by well-known techniques to ensure that there is a steep undercut 803 in the photoresist's profile.

In FIG. 16b, mesa 617 is etched using reactive ion etching into lower p-type layer 607 or into lower Bragg mirror 605. This forms pillar 617.

After this step is completed, the structure is transferred to an evaporator and is mounted so that the top surface of the device faces the evaporation source 805 of FIG. 16c.

The sample is tilted at an angle to the flux from the evaporation source 805. Depending on the material coverage required, the tilt usually ranges from 5° to 30° measured from a plane perpendicular to the direction of the flux from the evaporation source 805. During evaporation, the sample is rotated. In this particular example, rotation speeds of 10 to 100 turns per minute are used.

The insulating material which may be SiO or $SiO_2$ is deposited and built up on the whole device as shown in FIG. 16c. Insulator 807 is provided on layer 607. Insulator 809 also builds up on top of photoresist 801. Preferably, a lower base pressure and a slow deposition rate is preferred to produce a good quality uniform film without pin holes. For example, a pressure of $<1\times10^{-6}$ mbar and <1 nm/s respectively.

FIG. 16d schematically shows a device which has been fully coated with the insulator 807. The insulator 809 which is built up on the pillar 617 can then be removed by dissolving photoresist 801 using the appropriate solvent, for example, acetone. The solvent seeps into the undercut profile 803 allowing easy removal of the photoresist with minimal damage to the surface of pillar 617 as shown in FIG. 16e. Contacts may then be made to the relevant layers as described with reference to either of FIG. 14 or 15.

Figure 17:
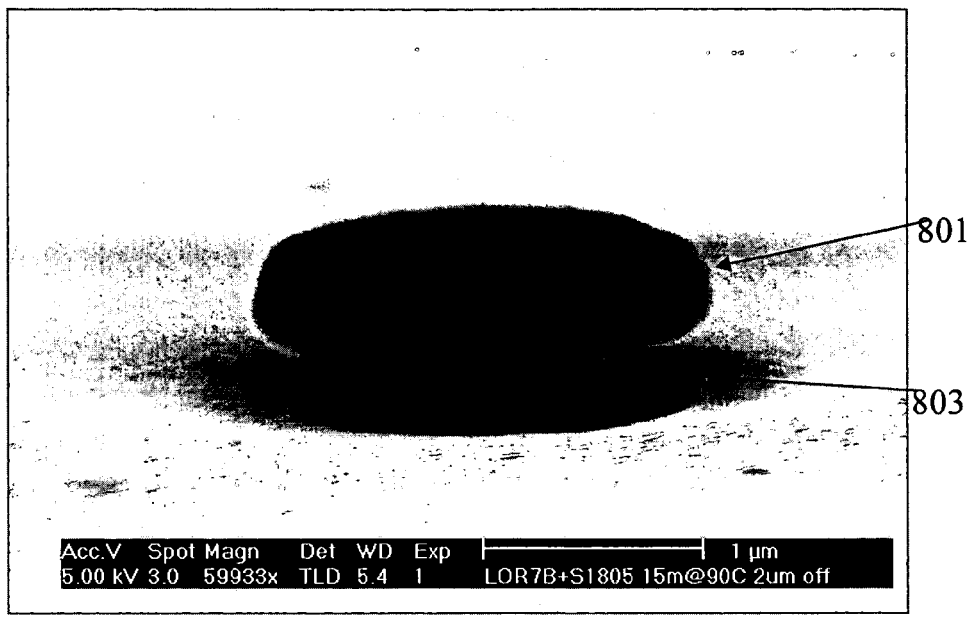
FIGS. 17a to 17d are pictures of the various fabrication stages explained with reference to FIGS. 16a to 16e.
Figure 17:
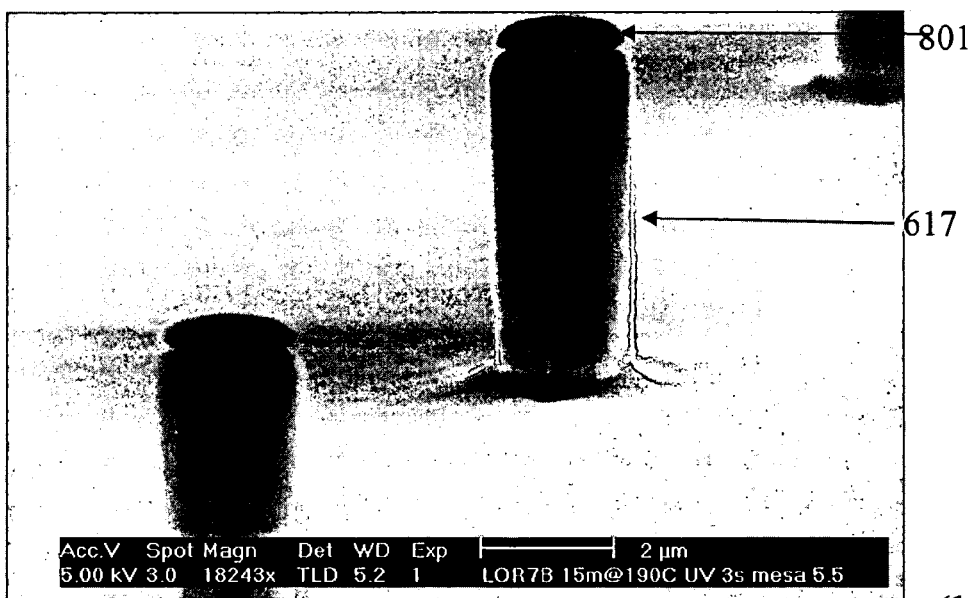
Figure 17:
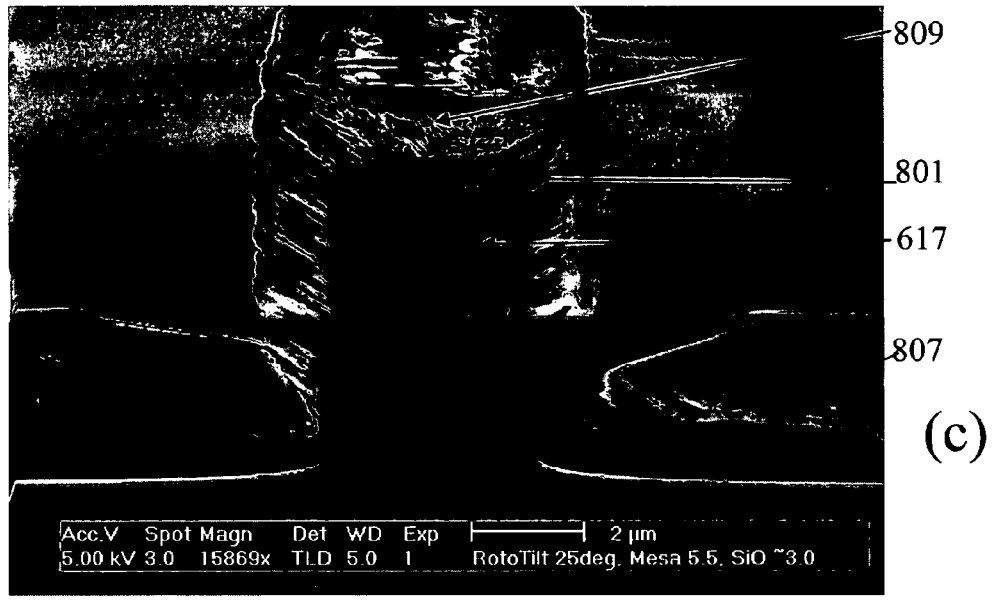
Figure 17:
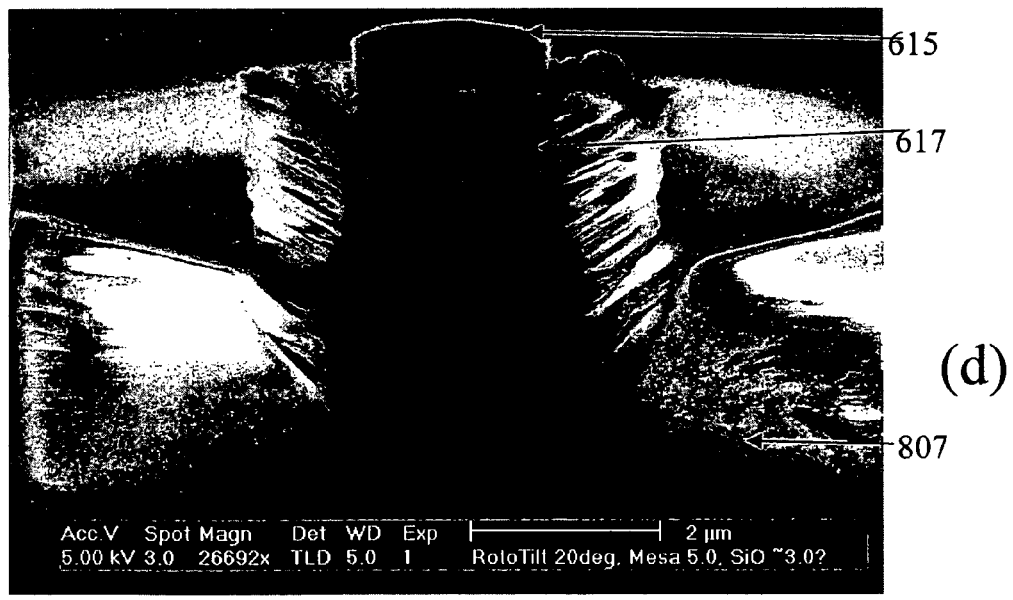

FIG. 17a to 17d show photographs of the various fabrication stages described with reference to FIGS. 16a to 16e. In FIG. 17a, an undercut bi-layer photoresist 801 is shown on the surface of a device. The undercut profile 803 is clearly visible, FIG. 17b shows mesa pillars 617 capped with photoresist 801. This corresponds to FIG. 16b.

After evaporation at an angle of 20 to 25° as described with reference to FIG. 16c and at 20 rotations per minute, the structure of FIG. 17c is produced where the photoresist 801 can still be seen on top of pillar 617. Insulator 809 is provided on top of photoresist 801 and insulator 807 is provided on the surface of the sample.

The photoresist 801 is then dissolved in a suitable solvent which dissolves the photoresist 801 and lifts off the insulator 809 which is adhered to the photoresist this leaving a clean top of pillar 617 surrounded by insulator 807.

The invention claimed is:
1. An optical device comprising:
an active stack of layers including an optical cavity;
at least one quantum dot located in said cavity;

an upper contact provided above said optical cavity, said upper contact being substantially transparent to the wavelength of radiation emitted from or absorbed by said quantum dot;

a lower contact provided below said cavity; and an insulator surrounding said optical cavity wherein the upper contact at least partially rests on the insulator such that said insulator at least partially supports said upper contact;

wherein a material interface defines the whole lateral boundary of said cavity and said cavity is patterned such that it provides two dimensional lateral confinement of photon modes such that said cavity laterally extends over an area with dimensions of the order of the wavelength of a photon emitted from said quantum dot, said upper and lower contacts being arranged such that current can flow vertically across the cavity between the two contacts.

2. An optical device according to claim 1, wherein said upper contact comprises a semiconductor layer.

3. An optical device according to claim 1, further comprising a lower mirror region wherein said lower contact comprises a layer provided below said lower mirror region.

4. An optical device according to claim 1, further comprising a lower mirror region wherein said lower contact comprises a layer provided between said lower mirror region and said cavity.

5. An optical device according to claim 1, wherein said upper contact extends farther than said insulator in at least one direction.

6. An optical device according to claim 5, wherein the upper contact comprises a plurality of layers of contact metal.

7. An optical device according to claim 1, wherein the upper contact rests on an etched or recessed surface of said insulator.

* * * * *